United States Patent
Katine et al.

(10) Patent No.: US 12,543,508 B2
(45) Date of Patent: Feb. 3, 2026

(54) CROSS-POINT MAGNETORESISTIVE MEMORY ARRAY CONTAINING SELECTOR RAILS AND METHOD OF MAKING THE SAME

(71) Applicant: SANDISK TECHNOLOGIES LLC, Addison, TX (US)

(72) Inventors: Jordan Katine, Mountain View, CA (US); Lei Wan, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 765 days.

(21) Appl. No.: 17/654,781

(22) Filed: Mar. 14, 2022

(65) Prior Publication Data

US 2023/0292628 A1 Sep. 14, 2023

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/10* (2023.02); *H10N 50/01* (2023.02)

(58) Field of Classification Search
CPC ...... H01F 10/329; H10N 50/01; H10N 50/80; H10B 61/00; H10B 61/10
See application file for complete search history.

(56) References Cited

U.S. PATENT DOCUMENTS

| 7,474,723 | B2 | 1/2009 | Oyama |
| 7,502,211 | B2 | 3/2009 | Gill |
| 7,733,685 | B2 | 6/2010 | Scheuerlein et al. |
| 9,252,362 | B2 | 2/2016 | Pio |
| 9,542,987 | B2 | 1/2017 | Naik et al. |
| 9,768,229 | B2 | 9/2017 | Braganca et al. |

(Continued)

FOREIGN PATENT DOCUMENTS

| WO | WO 2019/005162 A1 | 1/2019 |
| WO | WO 2019/005172 A1 | 1/2019 |

(Continued)

OTHER PUBLICATIONS

Notification of Transmittal of the International Search Report and Written Opinion of the International Search Authority for International Patent Application No. PCT/US2019/068899, mailed Apr. 26, 2020, 12 pages.

(Continued)

*Primary Examiner* — Davienne N Monbleau
*Assistant Examiner* — Heim Kirin Grewal
(74) *Attorney, Agent, or Firm* — THE MARBURY LAW GROUP PLLC

(57) ABSTRACT

A method of forming a memory device includes forming vertical stacks each including a respective first electrically conductive line and a respective selector rail over a substrate, such that the vertical stacks laterally extend along a first horizontal direction and are laterally spaced apart from each other along a second horizontal direction, forming magnetic tunnel junction material layers over the vertical stacks, and patterning the magnetic tunnel junction material layers and an upper portion of each of the selector rails to form a two-dimensional array of magnetic tunnel junctions and periodic notches at least in an upper portion of each of the selector rails.

20 Claims, 15 Drawing Sheets

(56) References Cited

U.S. PATENT DOCUMENTS

| | | |
|---|---|---|
| 9,830,966 B2 | 11/2017 | Mihajlovic et al. |
| 10,229,723 B1 | 3/2019 | Choi et al. |
| 10,249,683 B1 | 4/2019 | Lille et al. |
| 10,381,551 B1 | 8/2019 | Lille |
| 10,424,374 B2* | 9/2019 | Redaelli ............... H10N 70/882 |
| 10,553,783 B2 | 2/2020 | Lille |
| 10,726,892 B2 | 7/2020 | Le et al. |
| 10,788,547 B2 | 9/2020 | Kalitsov et al. |
| 10,797,227 B2 | 10/2020 | Le et al. |
| 10,811,596 B2 | 10/2020 | Le et al. |
| 10,862,022 B2 | 12/2020 | Le et al. |
| 11,056,534 B2 | 7/2021 | Wan et al. |
| 11,152,425 B2 | 10/2021 | Wan et al. |
| 11,271,035 B2 | 3/2022 | Wan et al. |
| 11,271,036 B2 | 3/2022 | Lille et al. |
| 2005/0220150 A1 | 10/2005 | Oyama |
| 2009/0290406 A1 | 11/2009 | Xia et al. |
| 2009/0290409 A1 | 11/2009 | Xia et al. |
| 2010/0054027 A1 | 3/2010 | Xia |
| 2010/0110776 A1 | 5/2010 | Yoon et al. |
| 2011/0267874 A1 | 11/2011 | Ryu et al. |
| 2013/0201757 A1 | 8/2013 | Li et al. |
| 2013/0215675 A1 | 8/2013 | Ryu et al. |
| 2014/0246741 A1* | 9/2014 | Guo ............... H10N 50/10 257/421 |
| 2016/0225423 A1 | 8/2016 | Naik et al. |
| 2017/0047510 A1 | 2/2017 | Chen et al. |
| 2017/0117027 A1 | 4/2017 | Braganca et al. |
| 2017/0117323 A1 | 4/2017 | Braganca et al. |
| 2017/0125078 A1 | 5/2017 | Mihajlovic et al. |
| 2018/0315475 A1* | 11/2018 | Redaelli ............... H10N 70/882 |
| 2018/0358547 A1* | 12/2018 | Yang ............... H10B 61/10 |
| 2018/0366642 A1 | 12/2018 | Yang et al. |
| 2019/0013353 A1 | 1/2019 | Lee et al. |
| 2019/0027201 A1 | 1/2019 | Petti et al. |
| 2019/0080738 A1 | 3/2019 | Choi et al. |
| 2019/0207088 A1 | 7/2019 | Schabes et al. |
| 2019/0287592 A1 | 9/2019 | Matsunami |
| 2020/0006633 A1 | 1/2020 | Lille |
| 2020/0342926 A1 | 10/2020 | Katine et al. |
| 2020/0350364 A1* | 11/2020 | Wan ............... H10B 61/22 |
| 2020/0411589 A1 | 12/2020 | Wan et al. |
| 2021/0126052 A1* | 4/2021 | Wan ............... H10N 50/80 |
| 2021/0217812 A1* | 7/2021 | Hsiao ............... H01L 23/5226 |
| 2021/0313392 A1 | 10/2021 | Wan et al. |
| 2021/0391530 A1* | 12/2021 | Chen ............... H10N 50/80 |
| 2021/0399207 A1* | 12/2021 | Wang ............... H10B 61/22 |
| 2021/0408114 A1 | 12/2021 | Lille et al. |
| 2022/0406994 A1* | 12/2022 | Lin ............... H10N 50/80 |

FOREIGN PATENT DOCUMENTS

| | | |
|---|---|---|
| WO | WO 2019/139774 A1 | 7/2019 |
| WO | WO 2020/222883 A1 | 11/2020 |

OTHER PUBLICATIONS

Notification of Transmittal of the International Search Report and Written Opinion of the International Search Authority for International Patent Application No. PCT/US2020/023707, mailed Jul. 28, 2020, 10 pages.

Kim, Y. et al. "Multilevel Spin-Orbit Torque MRAMs," IEEE Transactions on Electron Devices, vol. 62, No. 2, pp. 561-568, (2015).

U.S. Appl. No. 17/654,760, filed Mar. 14, 2022, SanDisk Technologies LLC.

U.S. Appl. No. 17/654,762, filed Mar. 14, 2022, SanDisk Technologies LLC.

U.S. Appl. No. 17/654,768, filed Mar. 14, 2022, SanDisk Technologies LLC.

U.S. Appl. No. 17/654,773, filed Mar. 14, 2022, SanDisk Technologies LLC.

U.S. Appl. No. 17/654,777, filed Mar. 14, 2022, SanDisk Technologies LLC.

* cited by examiner

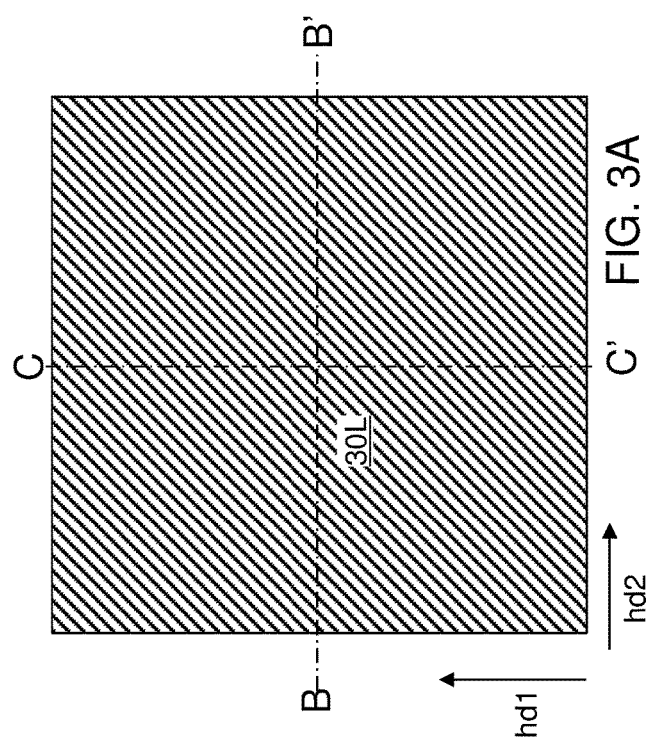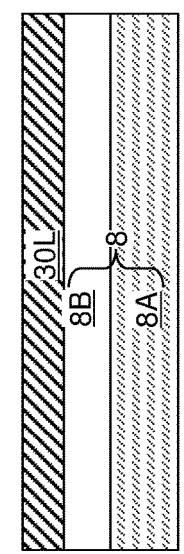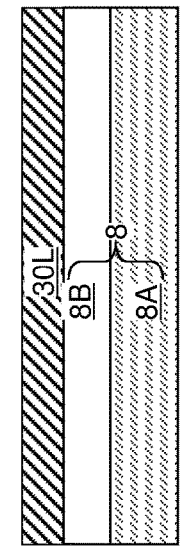

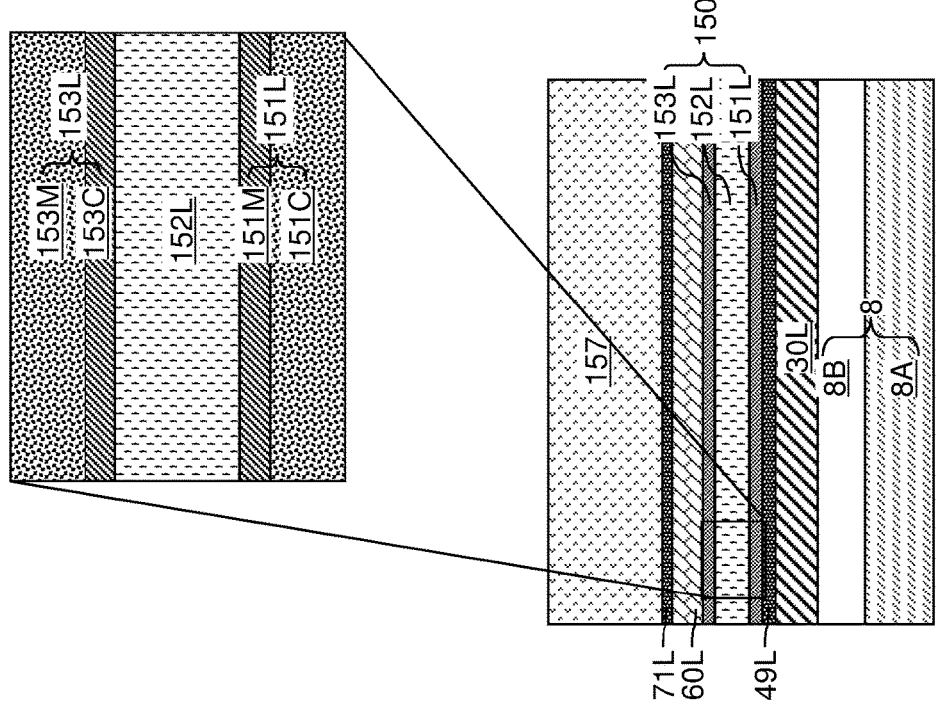
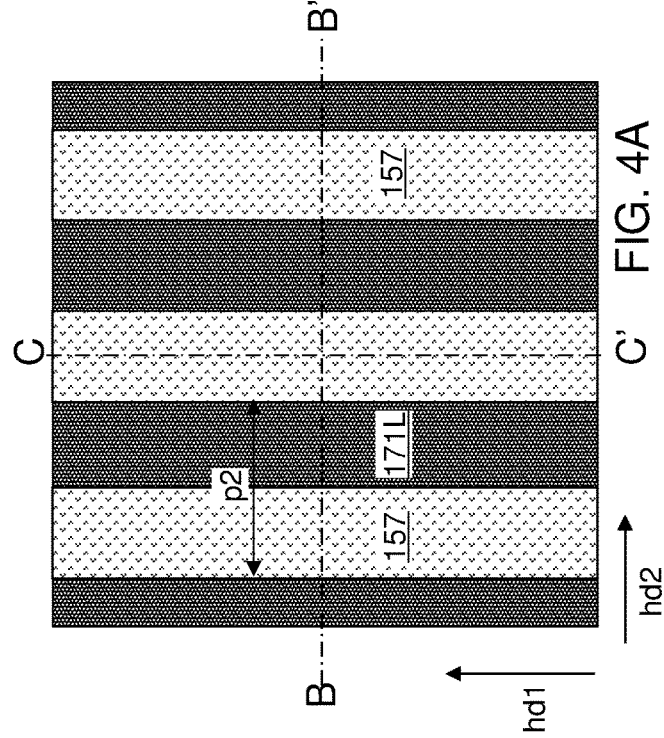
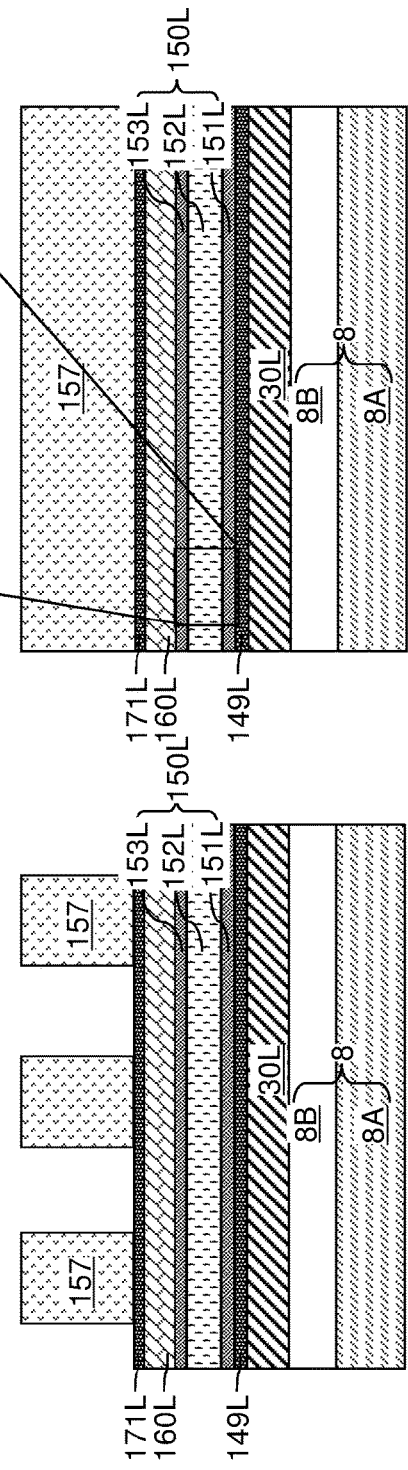
FIG. 4A
FIG. 4B
FIG. 4C

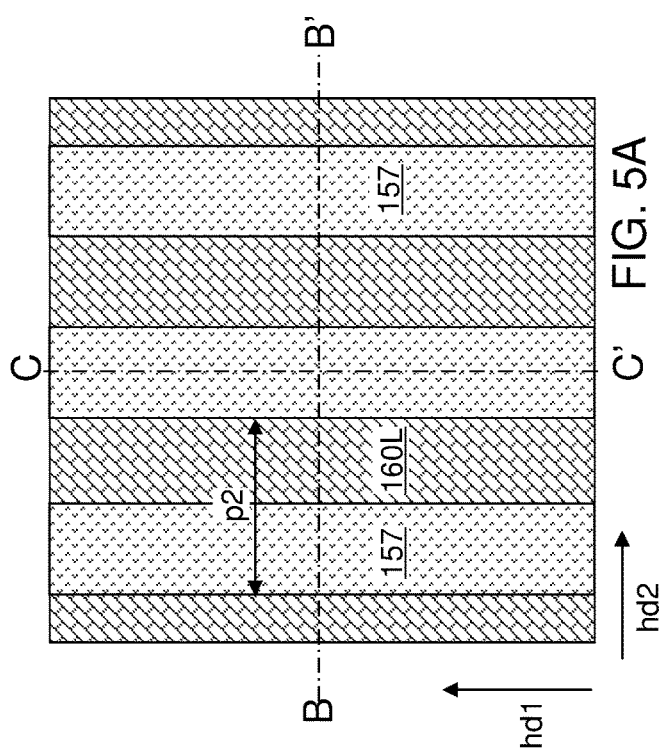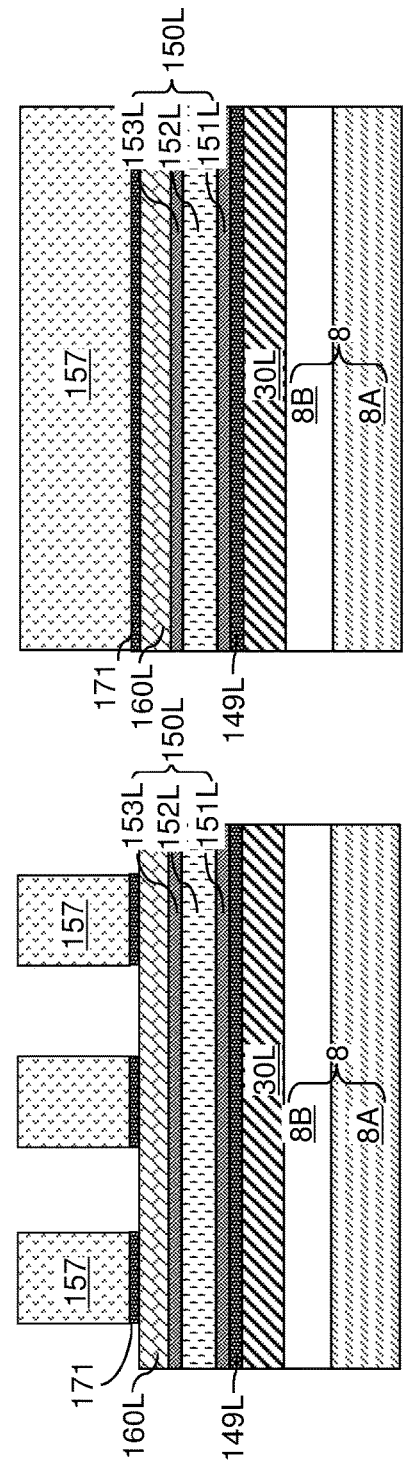

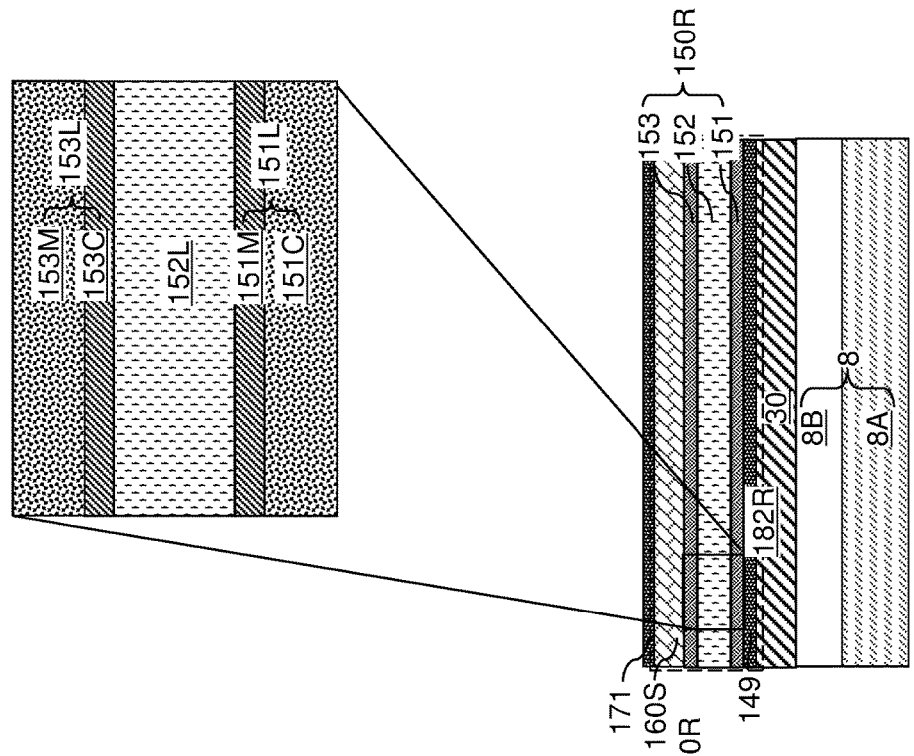
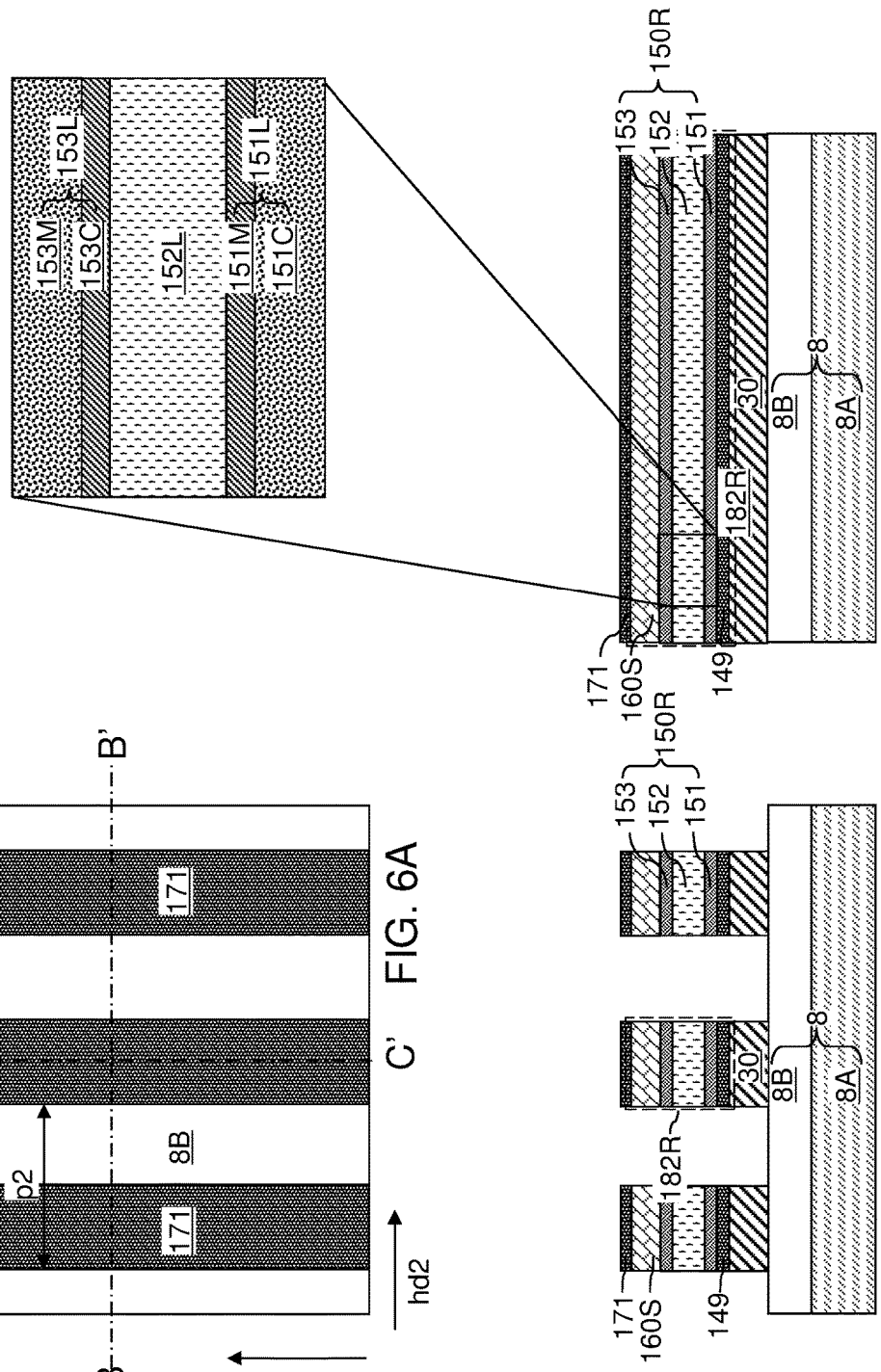
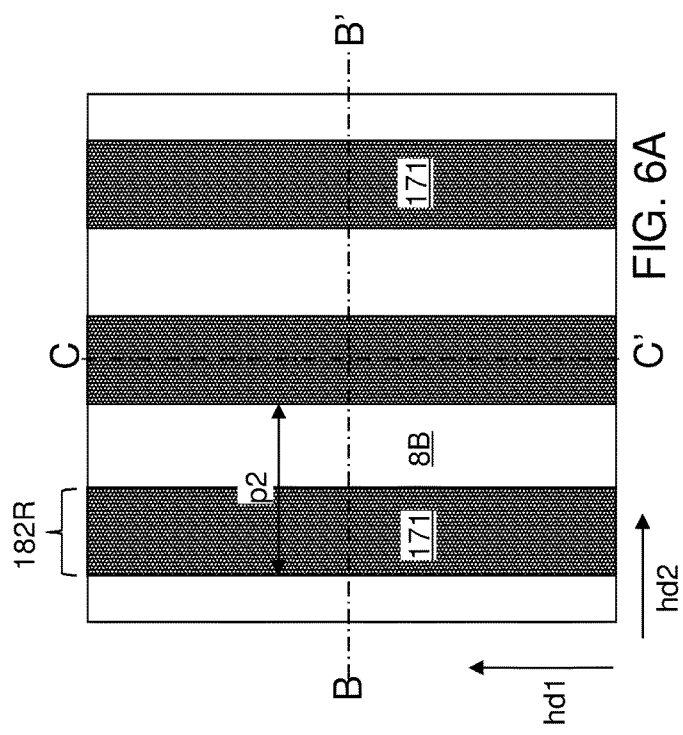

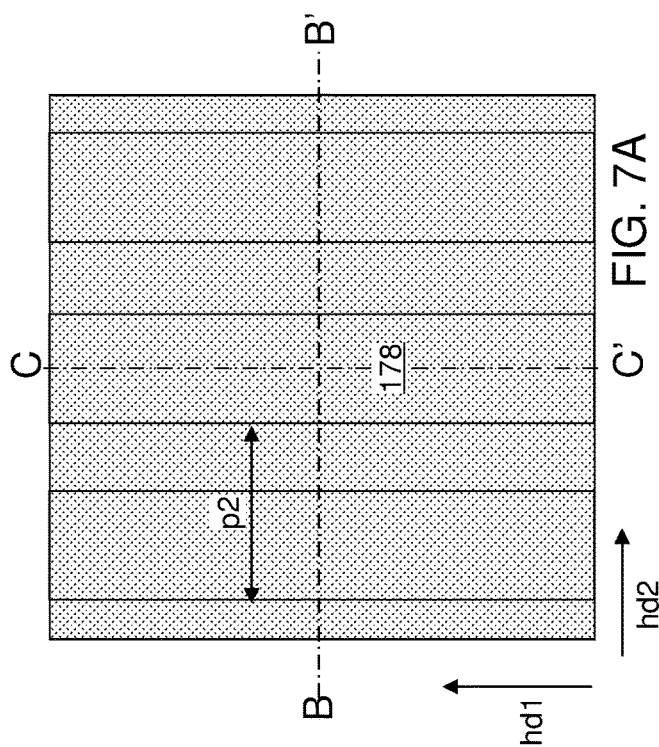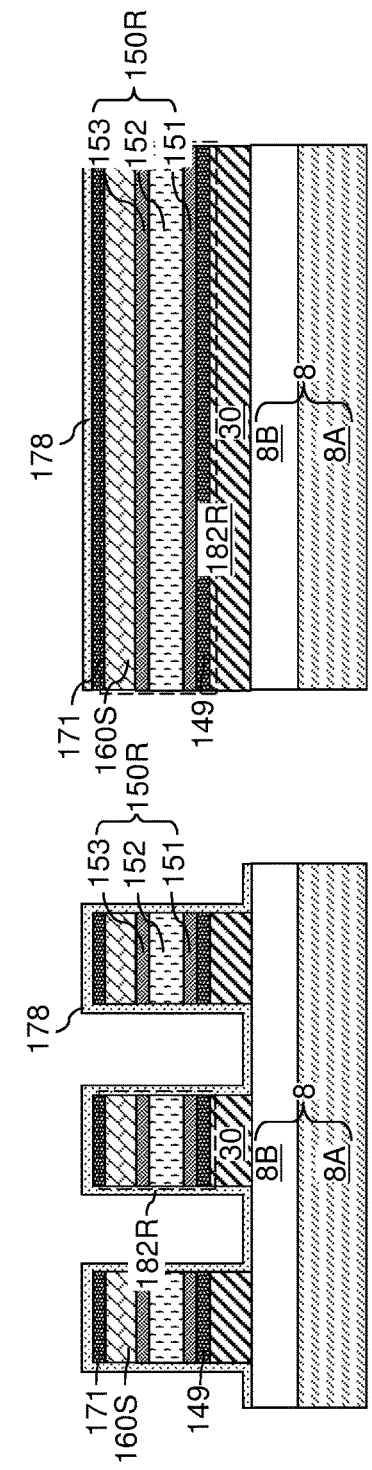

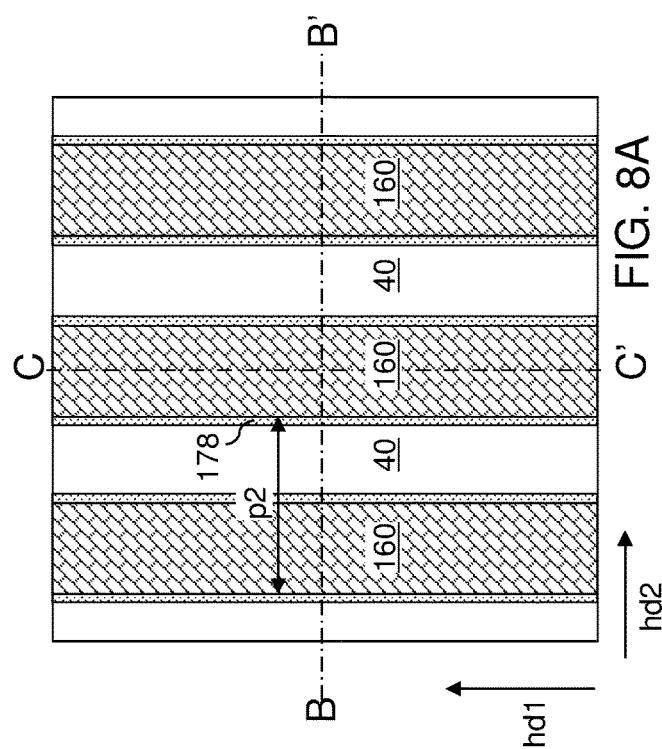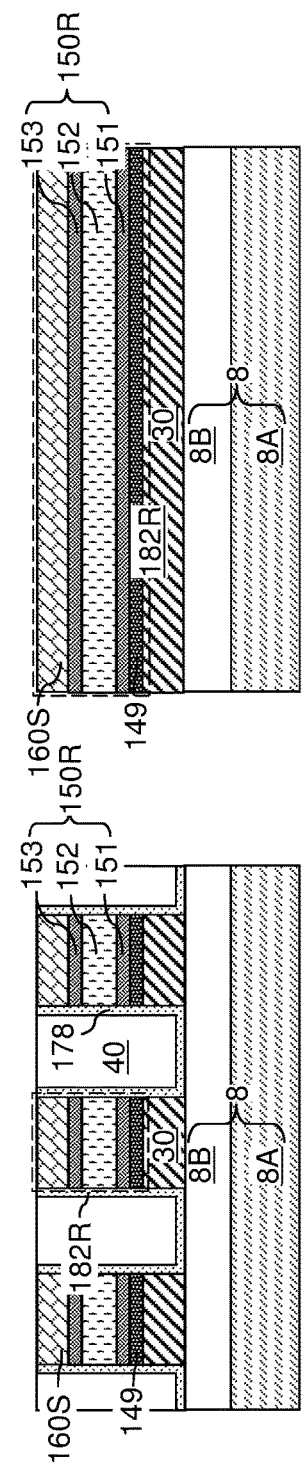

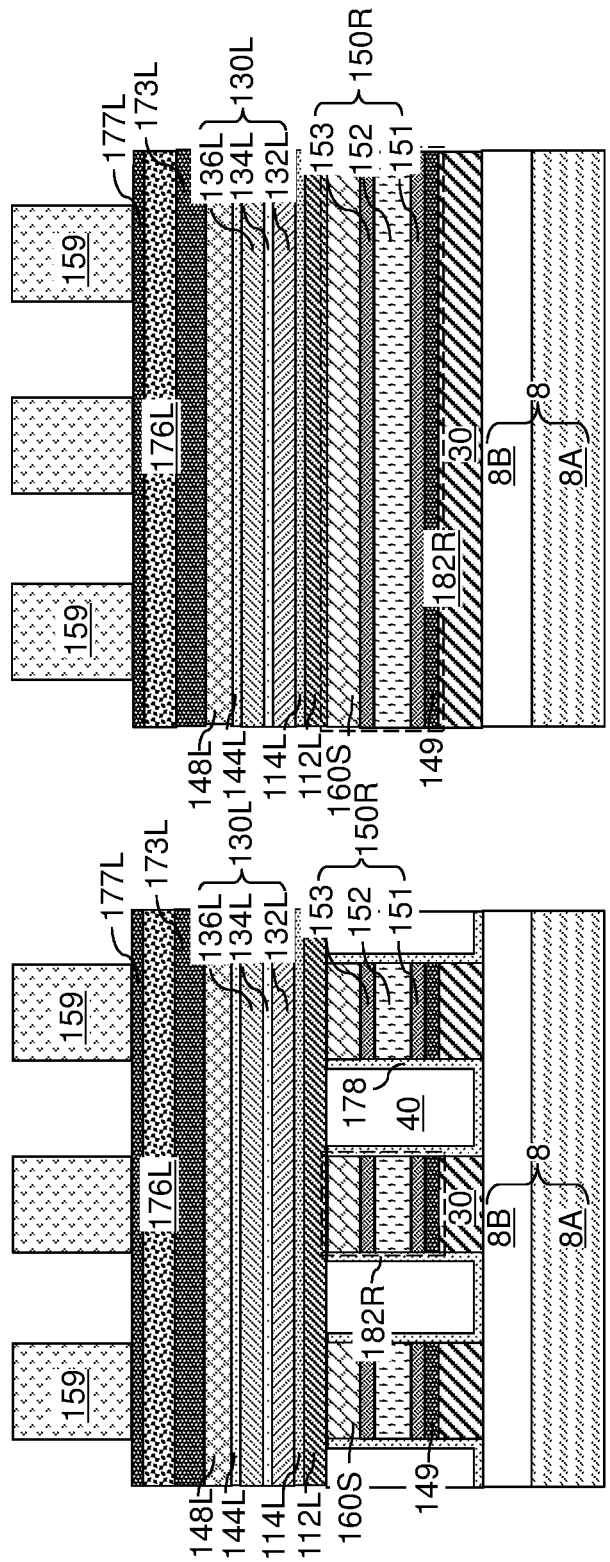

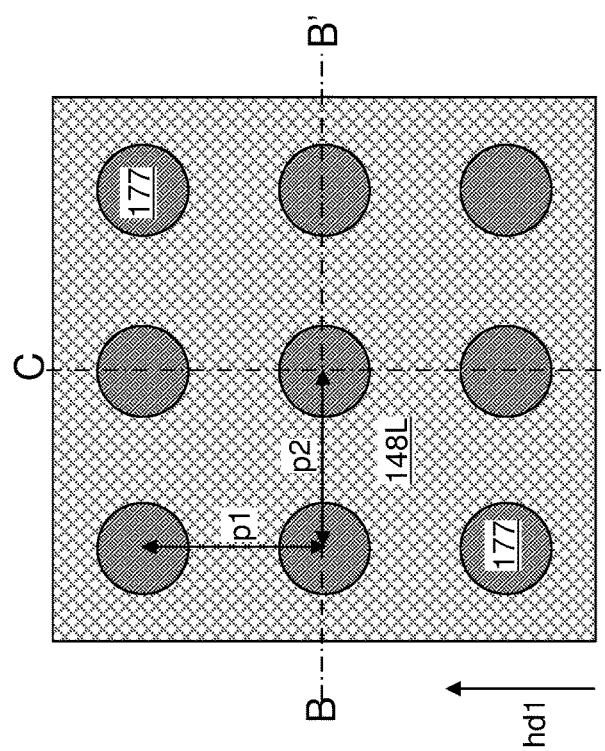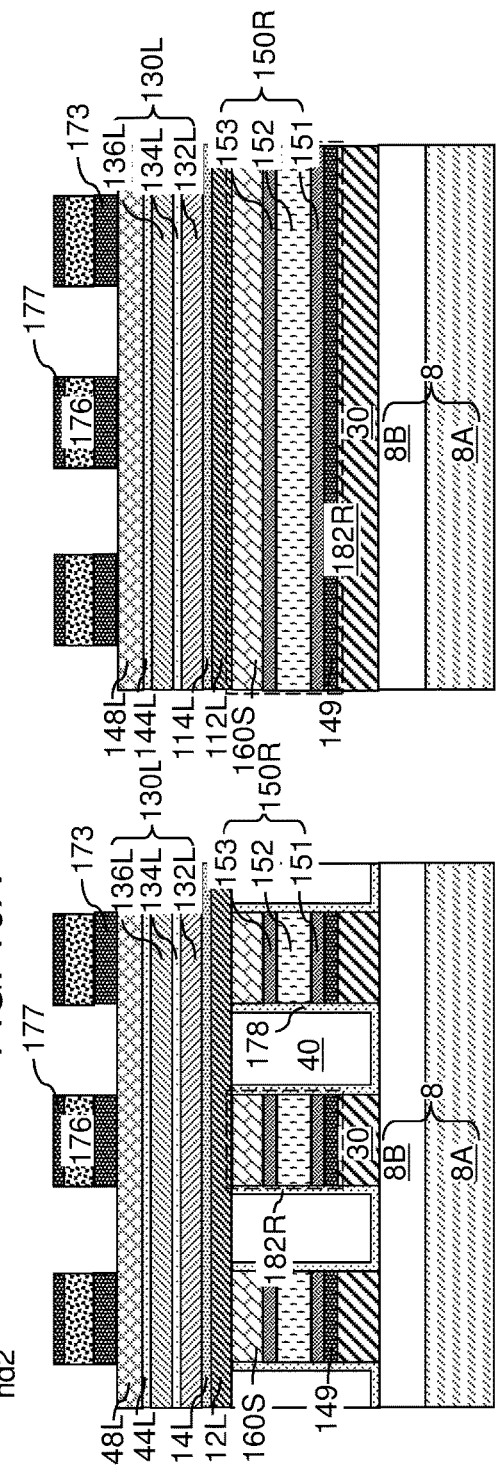
FIG. 10A
FIG. 10B
FIG. 10C

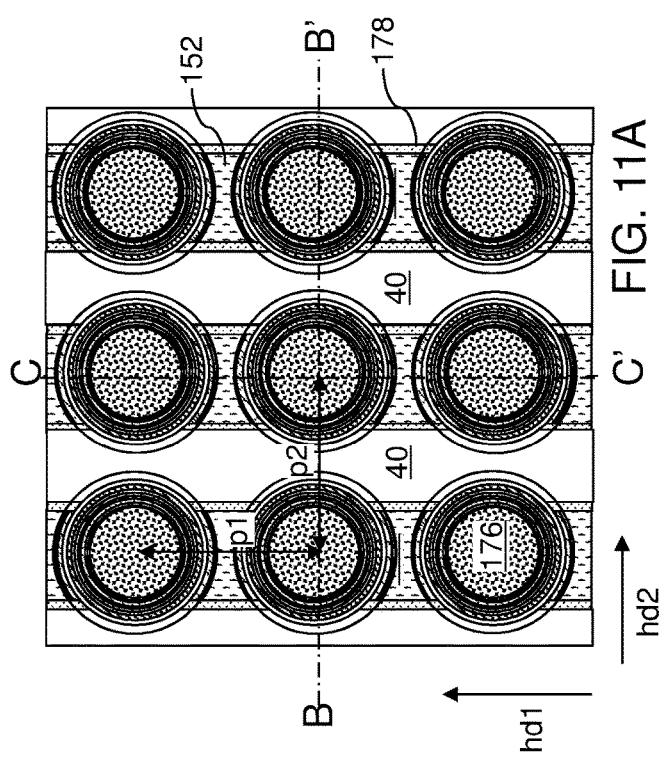
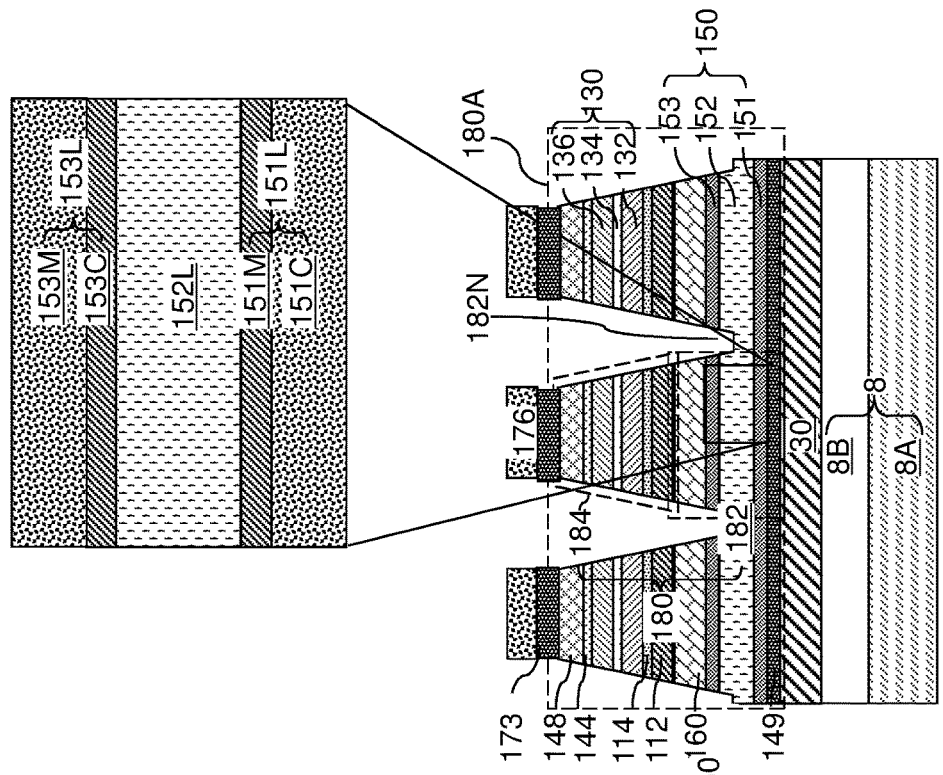
FIG. 11A
FIG. 11B
FIG. 11C

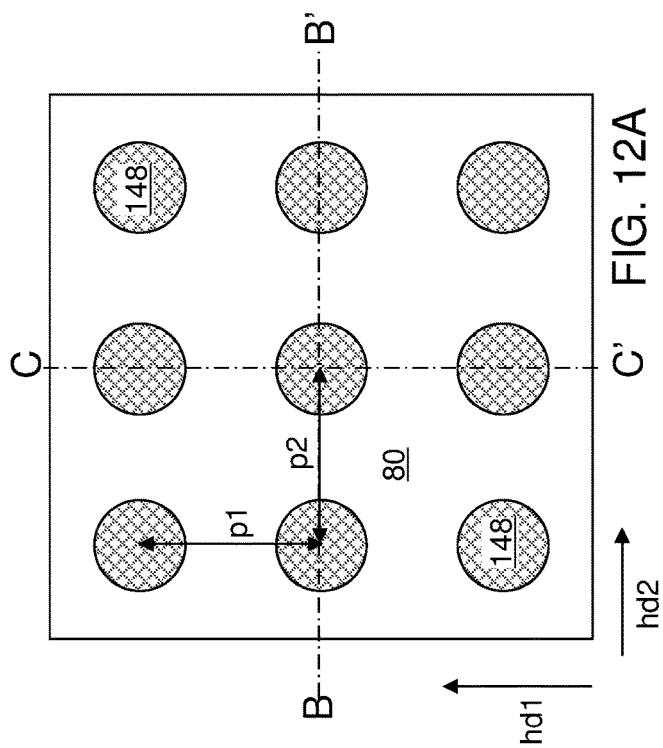
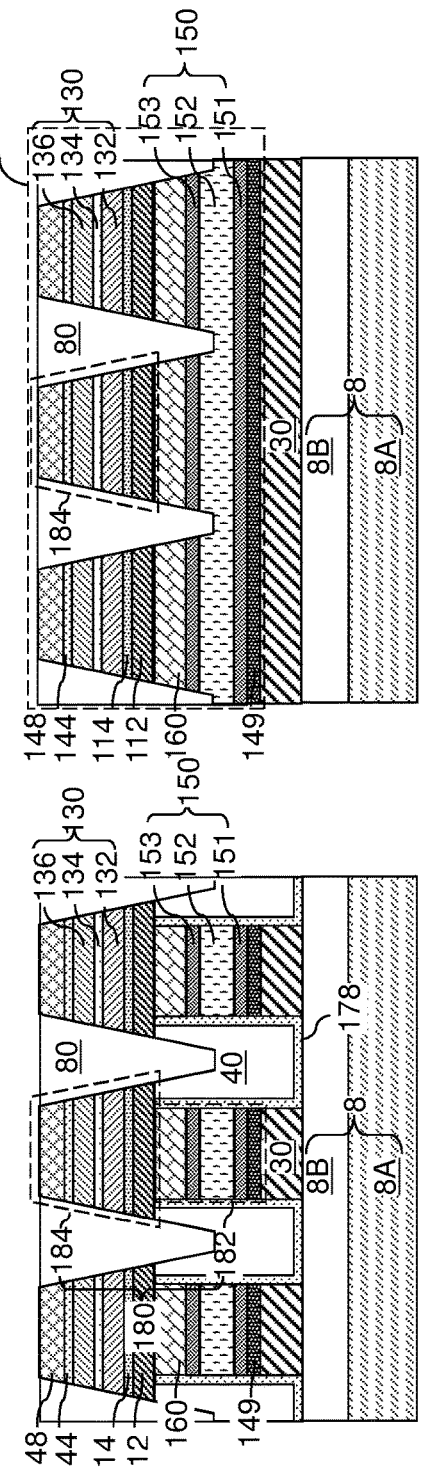
FIG. 12A
FIG. 12B
FIG. 12C

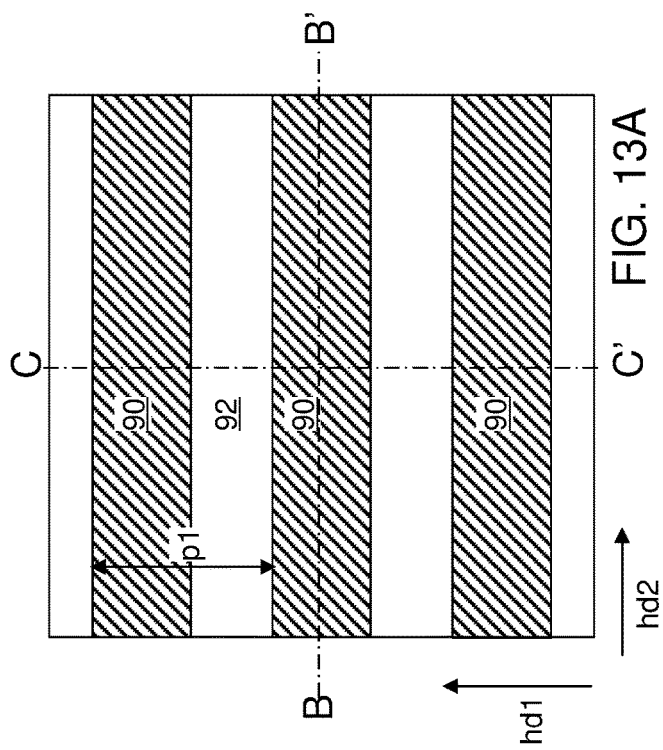
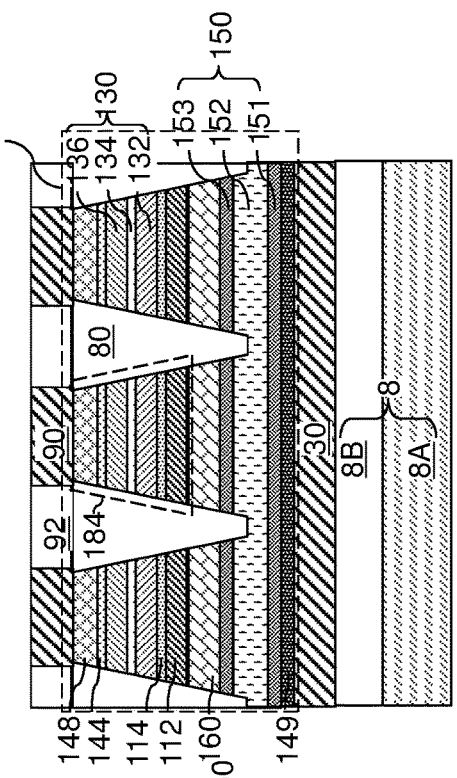
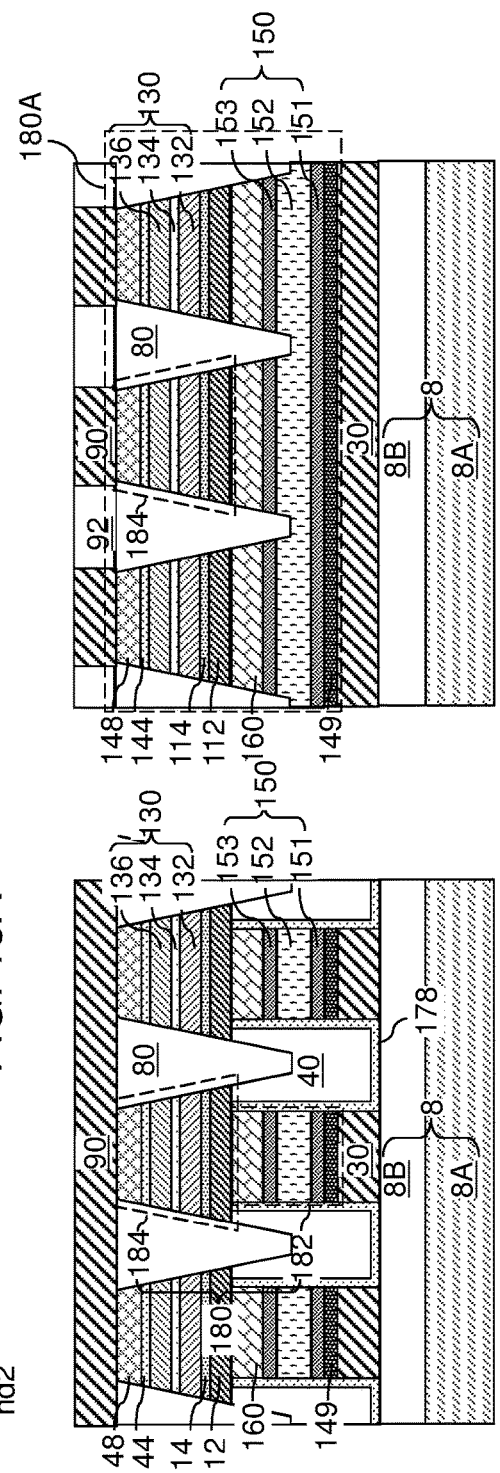
FIG. 13A
FIG. 13B
FIG. 13C

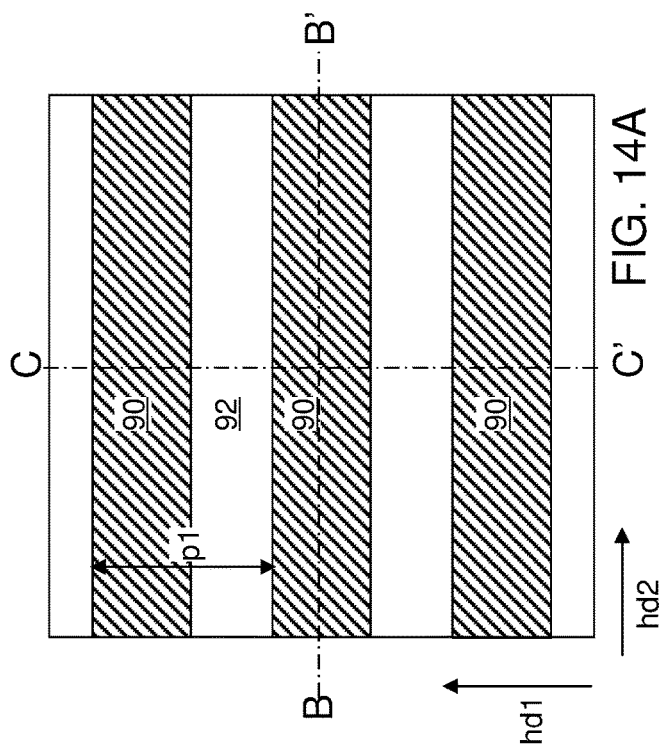
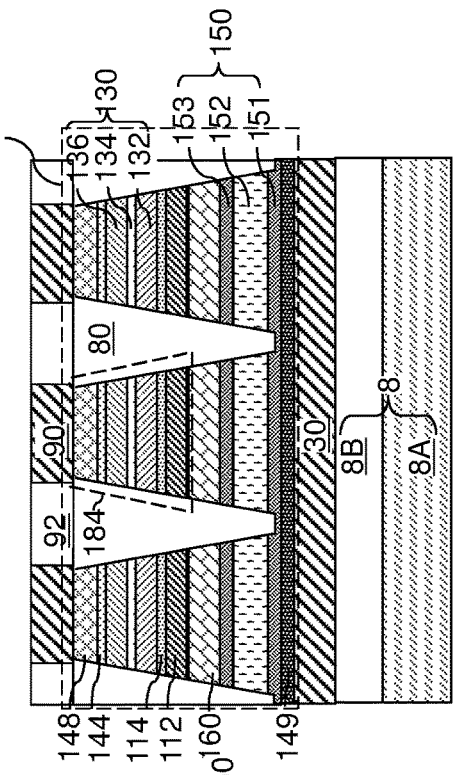
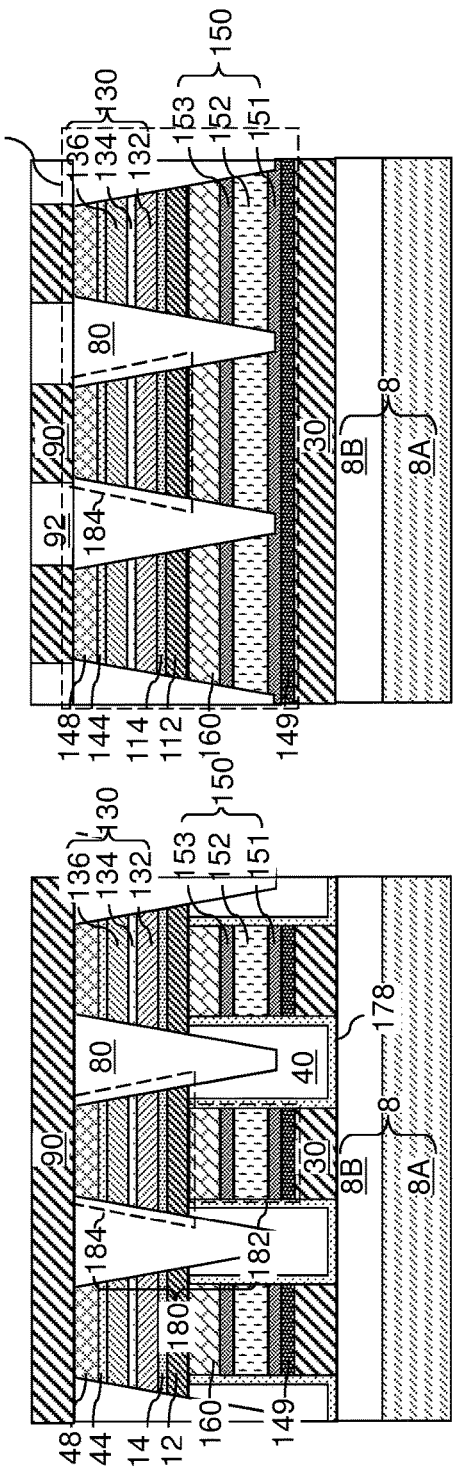

CROSS-POINT MAGNETORESISTIVE MEMORY ARRAY CONTAINING SELECTOR RAILS AND METHOD OF MAKING THE SAME

FIELD

The present disclosure relates generally to the field of magnetic memory devices, and particularly to a cross-point magnetoresistive random access memory array containing selector rails and methods of manufacturing the same.

BACKGROUND

Spin-transfer torque (STT) refers to an effect in which the orientation of a magnetic layer in a magnetic tunnel junction or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic tunnel junction or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic tunnel junction between different magnetization states of the free layer can be employed to store data within the magnetoresistive random access memory (MRAM) cell depending if the magnetization of the free layer is parallel or antiparallel to the magnetization of the polarizer layer, also known as a reference layer.

SUMMARY

According to an aspect of the present disclosure, a memory device is provided, which comprises: first electrically conductive lines laterally extending along a first horizontal direction and laterally spaced apart along a second horizontal direction; selector-magnetic tunnel junction (selector-MTJ) assemblies overlying the first electrically conductive lines, wherein each of the selector-MTJ assemblies is located over a respective one of the first electrically conductive lines and comprises a respective selector-containing notched rail structure that extends along the first horizontal direction and a respective row of magnetic tunnel junction (MTJ) pillar structures that are arranged along the first horizontal direction, and that overlie the respective selector-containing notched rail structure; a dielectric matrix layer laterally surrounding the rows of selector-MTJ assemblies, wherein a two-dimensional periodic array of downward protrusions of the dielectric matrix layer extends into boundaries between each neighboring pair of the selector-containing notched rail structures; and second electrically conductive lines laterally extending along the second horizontal direction and overlying a respective column of the MTJ pillar structures that are arranged along the second horizontal direction.

According to another aspect of the present disclosure, a method of forming a memory device includes forming vertical stacks each including a respective first electrically conductive line and a respective selector rail over a substrate, such that the vertical stacks laterally extend along a first horizontal direction and are laterally spaced apart from each other along a second horizontal direction, forming magnetic tunnel junction material layers over the vertical stacks, and patterning the magnetic tunnel junction material layers and an upper portion of each of the selector rails to form a two-dimensional array of magnetic tunnel junctions and periodic notches at least in an upper portion of each of the selector rails.

BRIEF DESCRIPTION OF THE DRAWINGS

FIGS. 3A-3C are various views of an exemplary structure after formation of a first electrically conductive layer according to an embodiment of the present disclosure. FIG. 3A is a top-down view, FIG. 3B is a vertical cross-sectional view along the vertical plane B-B' of FIG. 3A, and FIG. 3C is a vertical cross-sectional view along the vertical plane C-C' of FIG. 3A.

FIGS. 4A-4C are various views of the exemplary structure after formation of selector-level material layers, a first pattern transfer assist layer, and a first patterned photoresist layer according to an embodiment of the present disclosure. FIG. 4A is a top-down view, FIG. 4B is a vertical cross-sectional view along the vertical plane B-B' of FIG. 4A, and FIG. 4C is a vertical cross-sectional view along the vertical plane C-C' of FIG. 4A.

FIGS. 5A-5C are various views of the exemplary structure after formation of etch mask strips according to an embodiment of the present disclosure. FIG. 5A is a top-down view, FIG. 5B is a vertical cross-sectional view along the vertical plane B-B' of FIG. 5A, and FIG. 5C is a vertical cross-sectional view along the vertical plane C-C' of FIG. 5A.

FIGS. 6A-6C are various views of the exemplary structure after formation of selector rails and first electrically conductive lines according to an embodiment of the present disclosure. FIG. 6A is a top-down view, FIG. 6B is a vertical cross-sectional view along the vertical plane B-B' of FIG. 6A, and FIG. 6C is a vertical cross-sectional view along the vertical plane C-C' of FIG. 6A.

FIGS. 7A-7C are various views of the exemplary structure after formation of a dielectric spacer material layer according to an embodiment of the present disclosure. FIG. 7A is a top-down view, FIG. 7B is a vertical cross-sectional view along the vertical plane B-B' of FIG. 7A, and FIG. 7C is a vertical cross-sectional view along the vertical plane C-C' of FIG. 7A.

FIGS. 8A-8C are various views of the exemplary structure after formation of selector-level dielectric material portions according to an embodiment of the present disclosure. FIG. 8A is a top-down view, FIG. 8B is a vertical cross-sectional view along the vertical plane B-B' of FIG. 8A, and FIG. 8C is a vertical cross-sectional view along the vertical plane C-C' of FIG. 8A.

FIGS. 9A-9C are various views of the exemplary structure after formation of magnetic-tunnel-junction-level material layers, a patterning film, a second pattern transfer assist layer, and a second patterned photoresist layer according to an embodiment of the present disclosure. FIG. 9A is a top-down view, FIG. 9B is a vertical cross-sectional view along the vertical plane B-B' of FIG. 9A, and FIG. 9C is a vertical cross-sectional view along the vertical plane C-C' of FIG. 9A.

FIGS. 10A-10C are various views of the exemplary structure after formation of a two-dimensional array of etch mask plates according to an embodiment of the present disclosure. FIG. 10A is a top-down view, FIG. 10B is a vertical cross-sectional view along the vertical plane B-B' of FIG. 10A, and FIG. 10C is a vertical cross-sectional view along the vertical plane C-C' of FIG. 10A.

FIGS. 11A-11C are various views of the exemplary structure after formation of a two-dimensional array of magnetic tunnel junction pillar structures according to an embodiment of the present disclosure. FIG. 11A is a top-down view, FIG. 11B is a vertical cross-sectional view along the vertical plane B-B' of FIG. 11A, and FIG. 11C is a vertical cross-sectional view along the vertical plane C-C' of FIG. 11A.

FIGS. 12A-12C are various views of the exemplary structure after formation of a dielectric matrix layer according to an embodiment of the present disclosure. FIG. 12A is a top-down view, FIG. 12B is a vertical cross-sectional view along the vertical plane B-B' of FIG. 12A, and FIG. 12C is a vertical cross-sectional view along the vertical plane C-C' of FIG. 12A.

FIGS. 13A-13C are various views of the exemplary structure after formation of second electrically conductive lines according to an embodiment of the present disclosure. FIG. 13A is a top-down view, FIG. 13B is a vertical cross-sectional view along the vertical plane B-B' of FIG. 13A, and FIG. 13C is a vertical cross-sectional view along the vertical plane C-C' of FIG. 13A.

FIGS. 14A-14C are various views of a first alternative configuration of the exemplary structure after formation of second electrically conductive lines according to an embodiment of the present disclosure. FIG. 14A is a top-down view, FIG. 14B is a vertical cross-sectional view along the vertical plane B-B' of FIG. 14A, and FIG. 14C is a vertical cross-sectional view along the vertical plane C-C' of FIG. 14A.

DETAILED DESCRIPTION

Figure 1:
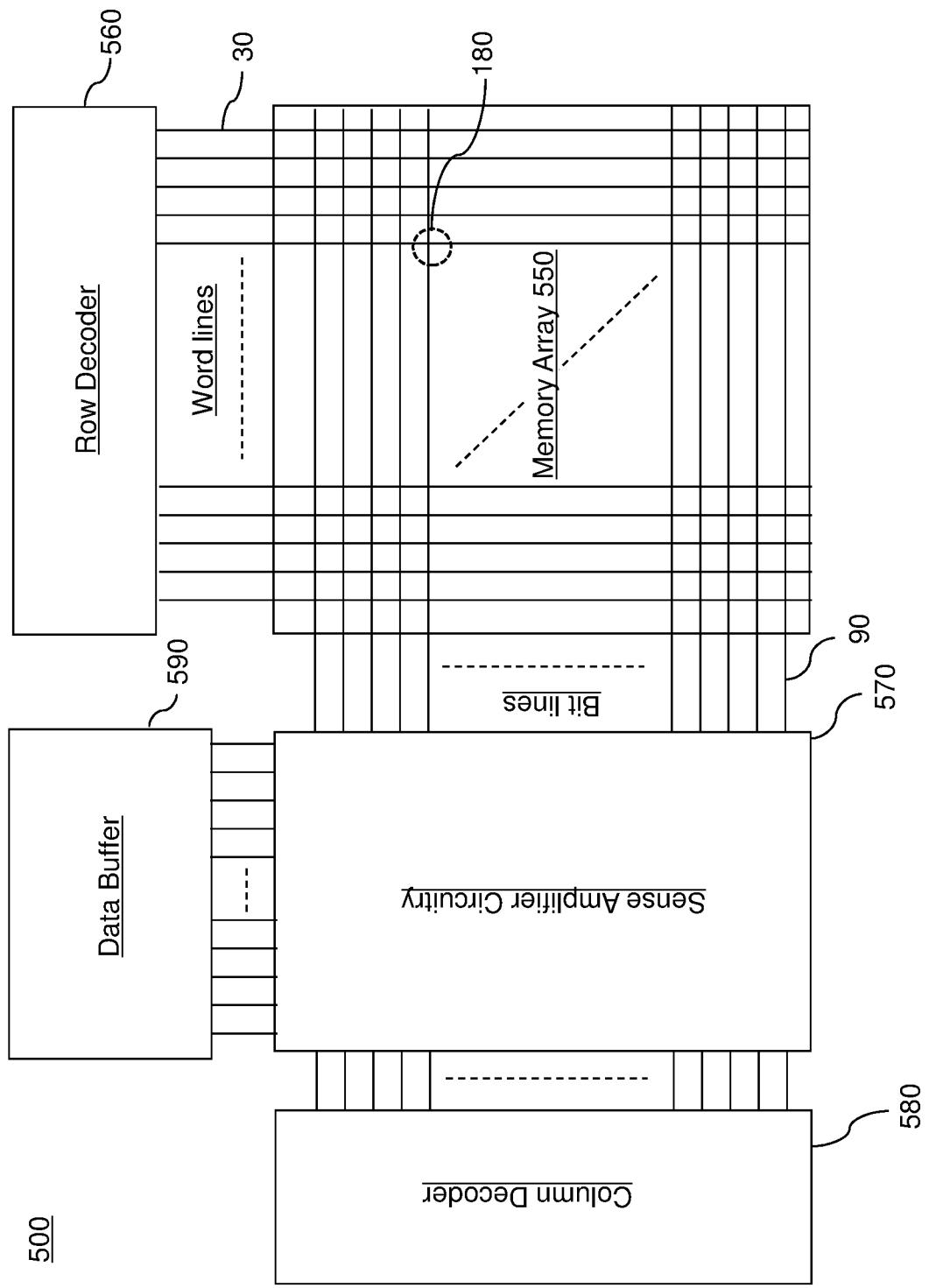
FIG. 1 is a schematic diagram of a memory device including resistive memory cells of the present disclosure in an array configuration.

As discussed above, the embodiments of the present disclosure are directed to a cross-point magnetoresistive memory array containing selector rails and methods of manufacturing the same, the various aspects of which are discussed herein in detail.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "conductive material" refers to a material having electrical conductivity greater than $1.0 \times 10^5$ S/cm. As used herein, an "insulating material" or a "dielectric material" refers to a material having electrical conductivity less than $1.0 \times 10^{-6}$ S/cm. As used herein, a "metallic material" refers to a conductive material including at least one metallic element therein. All measurements for electrical conductivities are made at the standard condition.

Referring to FIG. 1, a schematic diagram is shown for a magnetic memory device including memory cells 180 of an embodiment of the present disclosure in an array configuration. The magnetic memory device can be configured as a MRAM device 500 containing MRAM cells 180. As used herein, a "RAM device" refers to a memory device containing memory cells that allow random access, e.g., access to any selected memory cell upon a command for reading the contents of the selected memory cell. As used herein, an "MRAM device" refers to a RAM device in which the memory cells are magnetoresistive memory cells.

The MRAM device 500 of an embodiment of the present disclosure includes a memory array region 550 containing an array of the respective MRAM cells 180 located at the intersection of the respective word lines (which may comprise first electrically conductive lines 30 as illustrated or as second electrically conductive lines 90 in an alternate configuration) and bit lines (which may comprise second electrically conductive lines 90 as illustrated or as first electrically conductive lines 30 in an alternate configuration). The MRAM device 500 may also contain a row decoder 560 connected to the word lines, a sense circuitry 570 (e.g., a sense amplifier and other bit line control circuitry) connected to the bit lines, a column decoder 580 connected to the bit lines, and a data buffer 590 connected to the sense circuitry. Multiple instances of the MRAM cells 180 are provided in an array configuration that forms the MRAM device 500. As such, each of the MRAM cells 180 can be a two-terminal device including a respective first electrode and a respective second electrode. It should be noted that the location and interconnection of elements are schematic and the elements may be arranged in a different configuration. Further, a MRAM cell 180 may be manufactured as a discrete device, i.e., a single isolated device.

Each MRAM cell 180 includes a magnetic tunnel junction or a spin valve having at least two different resistive states depending on the alignment of magnetizations of different magnetic material layers. The magnetic tunnel junction or the spin valve is provided between a first electrode and a second electrode within each MRAM cell 180. Configurations of the MRAM cells 180 are described in detail in subsequent sections.

Figure 2:
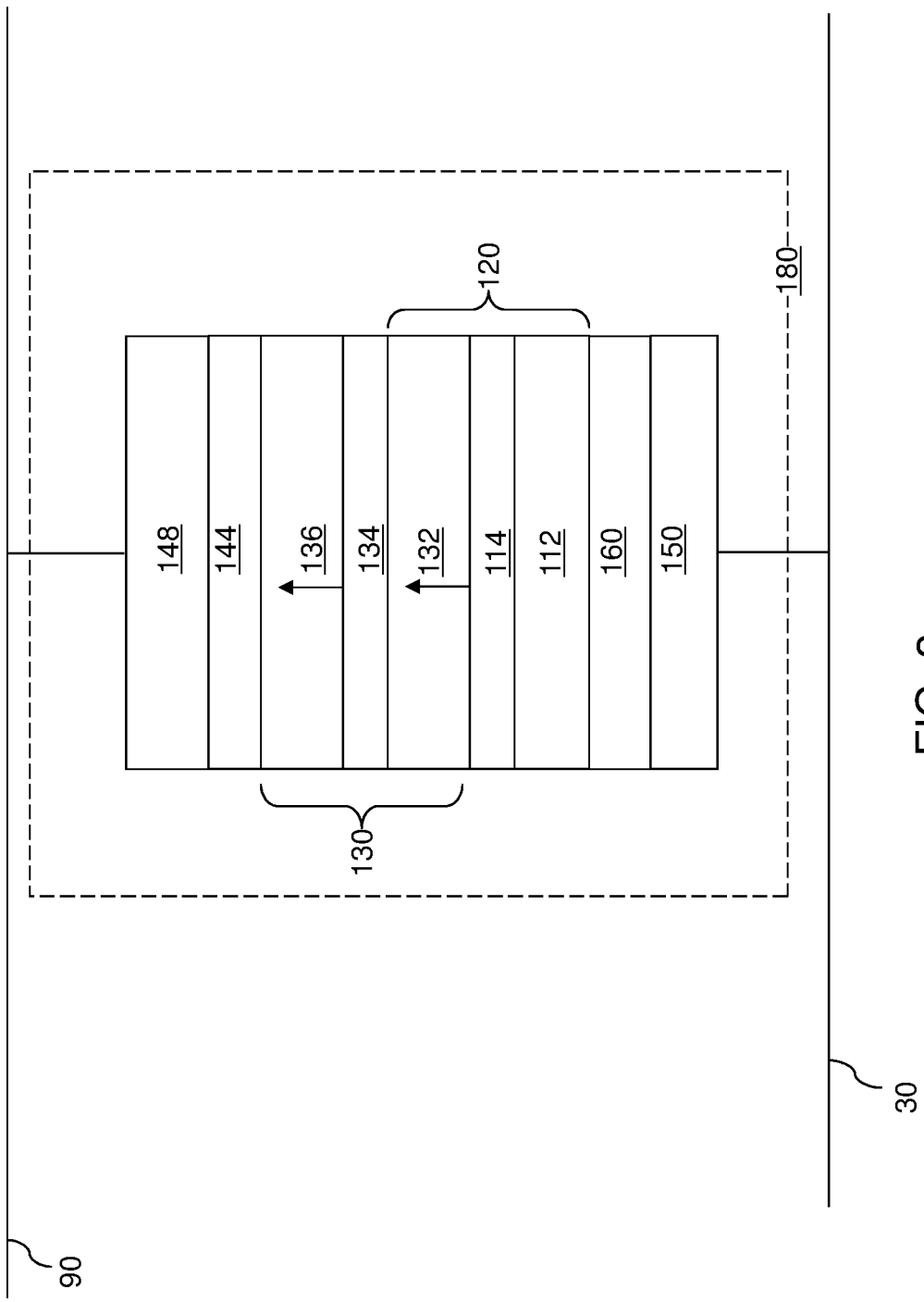
FIG. 2 illustrates an exemplary STT MRAM cell according to an embodiment of the present disclosure.

Referring to FIG. 2, an exemplary spin-transfer torque (STT) MRAM device is illustrated, which may comprise one MRAM cell 180 within the magnetic memory device illustrated in FIG. 1. The MRAM cell 180 of FIG. 2 can include a first terminal that may be electrically connected to, or comprises, a portion of a first electrically conductive line 30 and a second terminal that may be electrically connected to, or comprises, a portion of a second electrically conductive line 90. The first terminal can function as a first electrode, and the second terminal can function as a second electrode.

Generally, the MRAM cell 180 includes a magnetic tunnel junction (MTJ) 130. The magnetic tunnel junction 130 includes a reference layer 132 (which may also be referred to as a "pinned" layer) having a fixed vertical magnetization, a nonmagnetic tunnel barrier layer 134, and the free layer 136 (which may also be referred to as a "storage" layer) having a magnetization direction that can be programmed. The reference layer 132 and the free layer 136 can be separated by the nonmagnetic tunnel barrier layer 134 (which may be a dielectric layer such as an MgO layer), and have a magnetization direction perpendicular to the interface between the free layer 136 and the nonmagnetic tunnel barrier layer 134.

In one embodiment, the reference layer 132 is located below the nonmagnetic tunnel barrier layer 134, while the free layer 136 is located above the nonmagnetic tunnel barrier layer 134. An electrically conductive capping layer 148 may be formed on top of the free layer 136 in order to provide additional perpendicular anisotropy. A dielectric capping layer 144 may be provided between the free layer 136 and the electrically conductive capping layer 148. In one embodiment, the reference layer 132 and the free layer 136 have respective positive uniaxial magnetic anisotropy. Positive uniaxial magnetic anisotropy is also referred to as perpendicular magnetic anisotropy (PMA) in which a minimum energy preference for quiescent magnetization is along the axis perpendicular to the plane of the magnetic film.

The configuration in which the reference layer 132 and the free layer 136 have respective perpendicular magnetic anisotropy provides bistable magnetization states for the free layer 136. The bistable magnetization states include a parallel state in which the free layer 136 has a magnetization (e.g., magnetization direction) that is parallel to the fixed vertical magnetization (e.g., magnetization direction) of the reference layer 132, and an antiparallel state in which the free layer 136 has a magnetization (e.g., magnetization direction) that is antiparallel to the fixed vertical magnetization (e.g., magnetization direction) of the reference layer 132.

A data bit can be written in the STT MRAM cell by passing high enough electrical current through the reference layer 132 and the free layer 136 in a programming operation so that spin-transfer torque can set or reset the magnetization state of the free layer 136. The direction of the magnetization of the free layer 136 after the programming operation depends on the current polarity with respect to magnetization direction of the reference layer 132. The data bit can be read by passing smaller electrical current through the STT MRAM cell and measuring the resistance of the STT MRAM cell. The data bit "0" and the data bit "1" correspond to low and high resistance states of the STT MRAM cell (or vice versa), which are provided by parallel or antiparallel alignment of the magnetization directions of the free layer 136 and the reference layer 132, respectively. The relative resistance change between parallel and antiparallel alignment (i.e., orientation) of the magnetization direction is called tunnel magnetoresistance (TMR).

In one embodiment, the reference layer 132 and the free layer 136 may include one or more ferromagnetic layers, such as CoFe or CoFeB. In plural ferromagnetic layers are included in the reference layer 132, then a thin non-magnetic layer comprised of tantalum or tungsten having a thickness of 0.2 nm~0.5 nm may be located between the ferromagnetic layers. The nonmagnetic tunnel barrier layer 134 can include any tunneling barrier material such as an electrically insulating material, for example magnesium oxide. The thickness of the nonmagnetic tunnel barrier layer 134 can be 0.7 nm to 1.3 nm, such as about 1 nm.

The reference layer 132 may be provided as a component within a synthetic antiferromagnetic structure (SAF structure) 120 which is formed over an optional nonmagnetic metallic seed layer 160, such as a Ta and/or Pt seed layer. In one embodiment, the SAF structure 120 can include a vertical stack including at least one superlattice 112 and an antiferromagnetic coupling layer 114 located between the reference layer 132 and the at least one superlattice 112. In one embodiment, the at least one superlattice 112 may comprise a first superlattice and a second superlattice. The antiferromagnetic layer 114 may comprise an Jr or an IrMn alloy layer located between the first and the second superlattices. In one embodiment, the first superlattice comprises N1 repetitions of a first unit layer stack of the first cobalt layer and the first platinum layer, and a first capping cobalt layer, such that N1 of the first platinum layers are interlaced with (N1+1) of the first cobalt layers, where N1 is an integer in a range from 2 to 10. The second superlattice comprises N2 repetitions of a second unit layer stack of the second cobalt layer and the second platinum layer, and a second capping cobalt layer, such that N2 first platinum layers are interlaced with (N2+1) second cobalt layers, where N2 is an integer in a range from 2 to 10. Other SAF structures 120 may be used. For example, a superlattice layer may be used instead of the at least one superlattice 112. The superlattice layer 112 includes a ferromagnetic material having perpendicular magnetic anisotropy. The magnetization of the reference layer 132 can be antiferromagnetically coupled to the magnetization of the superlattice layer 112.

The electrically conductive capping layer 148, if present, can include a nonmagnetic metal layer or multilayers, such as ruthenium, tungsten and/or tantalum. The electrically conductive capping layer 148 may be a portion of a second electrically conductive line 90, or may be an electrically conductive structure that underlies the second electrically conductive line 90.

In one embodiment, the insulating cap layer 144 may comprise a thin magnesium oxide layer that is thin enough to enable tunneling of electrical current, such as a thickness in a range from 4 Angstroms to 10 Angstroms. In one embodiment, the MRAM cell 180 can be a single tunnel junction device that includes only one magnetic tunnel junction 130.

A selector element 150 can be formed in a series connection with the magnetic tunnel junction 130. The selector element 150 includes a selector material that provides a bidirectional current flow when the current or voltage exceeds a threshold value. Thus, the selector element 150 is a bidirectional selector device which permits bidirectional current flow when the current or voltage exceeds a threshold value and blocks current flow when the current or voltage is below the threshold value. The selector element 150 may include an ovonic threshold switch (OTS) material that allows flow of electrical current only when a voltage differential thereacross exceeds a threshold voltage value. As used herein, an "ovonic threshold switch material" refers to a material that displays a non-linear resistivity curve under an applied external bias voltage such that the resistivity of the material decreases with the magnitude of the applied external bias voltage. In other words, an ovonic threshold switch material is non-Ohmic, and becomes more conductive under a higher external bias voltage than under a lower external bias voltage. An ovonic threshold switch material can be non-crystalline (for example, by being amorphous) at a non-conductive state, and can remain non-crystalline (for example, by remaining amorphous) at a conductive state, and can revert back to a high resistance state when a high voltage bias thereacross is removed, i.e., when not subjected to a large voltage bias across a layer of the ovonic threshold voltage material. Throughout the resistive state changes, the ovonic threshold switch material can remain amorphous. In one embodiment, the ovonic threshold switch material can comprise a chalcogenide material. The chalcogenide material may be a GeSeAs alloy, a GeSeAsTe alloy, a GeTeAs alloy, a GeSeTe alloy, a GeSe alloy, a SeAs alloy, a AsTe alloy, a GeTe alloy, a SiTe alloy, a SiAsTe alloy, or SiAsSe alloy. The chalcogenide material may be undoped or doped with at least one of N, O, C, P, Ge, As, Te, Se, In, or Si.

The selector element 150 may also include one or more electrically conductive and/or barrier layers, such as tungsten, tungsten nitride, tantalum, tantalum nitride, a carbon-nitrogen layer, etc.). The electrically conductive and/or barrier layers may be located above and/or below the ovonic threshold switch material.

The layer stack including the selector element 150, the SAF structure 120, the magnetic tunnel junction 130, the insulating cap layer 144 and the electrically conductive capping layer 148 can be annealed to induce crystallographic alignment between the crystalline structure of the nonmagnetic tunnel barrier layer 134 (which may include crystalline MgO having a rock salt crystal structure) and the crystalline structure within the free layer 136.

In one embodiment, the reference layer 132 has a fixed vertical magnetization that is perpendicular to an interface between the reference layer 132 and the nonmagnetic tunnel barrier layer 134. The free layer 136 has perpendicular magnetic anisotropy to provide bistable magnetization states that include a parallel state having a magnetization that is parallel to the fixed vertical magnetization and an antiparallel state having a magnetization that is antiparallel to the fixed vertical magnetization. The magnetization direction of the free layer 136 can be flipped (i.e., from upward to downward or vice versa) by flowing electrical current through the discrete patterned layer stack (120, 130, 144, 148, 150, 170).

Referring to FIGS. 3A and 3B, an exemplary structure for forming a two-dimensional array of STT MRAM cells 180 is illustrated. The exemplary structure can be provided by forming a layer stack of blanket (unpatterned) layers over a substrate 8. The substrate 8 may comprise, for example, a semiconductor substrate 8A and at least one dielectric material layer 8B formed over the semiconductor substrate 8A. Alternatively, an insulating substrate 8 (e.g., a ceramic or a glass substrate) or a conductive substrate 8 (e.g., a metal or metal alloy substrate) may be used instead. In one embodiment, various semiconductor devices (not shown) including switching devices and peripheral (i.e., driver) circuits may be formed over the semiconductor substrate 8A, and metal interconnect structures (not shown) may be formed in the at least one dielectric material layer 8B. The various semiconductor devices, if present, may comprise the various driver circuits of the MRAM device 500 illustrated in FIG. 1 other than the memory array region 550, which is subsequently formed in subsequent processing steps.

A first electrically conductive layer 30L can be deposited over the substrate 8. The first electrically conductive layer 30L includes a first nonmagnetic electrically conductive material such as Al, Cu, W, Ru, Mo, Nb, Ti, Ta, TiN, TaN, WN, MoN, or a combination thereof. The thickness of the first electrically conductive layer 30L can be in a range from 20 nm to 100 nm, although lesser and greater thicknesses can also be employed.

Referring to FIGS. 4A-4C, an optional metallic adhesion layer 149L, selector-level material layers (150L, 160L), and an optional first image transfer assist layer 171L can be formed over the first electrically conductive layer 30L. The optional metallic adhesion layer 149L comprises a metallic material that promotes adhesion of the selector-level material layers (150L, 160L). For example, the optional metallic adhesion material layer 149L may comprise a metallic material such as Ta, Ti, TaN, TiN, or WN. The thickness of the metallic adhesion material layer 149L may be in a range from 1 nm to 30 nm, although lesser and greater thicknesses may also be employed.

The selector-level material layers (150L, 160L) can include, from bottom to top, selector material layers 150L and an optional conductive material layer 160L (e.g., seed layer). The selector material layers 150L can comprise, from bottom to top, a lower selector electrode material layer 151L, a non-Ohmic selector material layer 152L, and an upper selector electrode material layer 153L. The lower selector electrode material layer 151L includes at least one material that may be employed for lower selector electrodes to be subsequently formed. The non-Ohmic selector material layer 152L includes a selector material that exhibits a non-Ohmic switching behavior. The upper selector electrode material layer 153L includes at least one material that may be employed upper selector electrodes to be subsequently formed.

In one embodiment, the lower selector electrode material layer 151L may comprise a layer stack including a lower carbon-based electrode material layer 151C and a lower metallic material layer 151M formed on the lower carbon-based electrode material layer 151C. In one embodiment, the upper selector electrode material layer 153L may comprise a layer stack including an upper metallic material layer 153M and an upper carbon-based electrode material layer 153C formed on the upper metallic material layer 153M.

The lower carbon-based electrode material layer 151C and the upper carbon-based electrode material layer 153C within the selector-level material layers can include a respective carbon-based conductive material including carbon atoms at an atomic concentration greater than 50%. In one embodiment, the lower carbon-based electrode material layer 151C and the upper carbon-based electrode material layer 153C may include carbon atoms at an atomic concentration in a range from 50% to 100%, such as from 70% to 100% and/or from 80% to 100%. In one embodiment, each of lower carbon-based electrode material layer 151C and the upper carbon-based electrode material layer 153C comprises a respective material selected from diamond-like carbon (DLC), a carbon nitride material, and a carbon-rich conductive compound of carbon atoms and non-carbon atoms. Each of the lower carbon-based electrode material layer 151C and the upper carbon-based electrode material layer 153C may have a respective thickness in a range from 3 nm to 300 nm, although lesser and greater thicknesses may also be employed.

The lower metallic material layer 151M and the upper metallic material layer 153M within the selector material layers 150L can include a respective metallic material having electrical conductivity that is greater than the electrical conductivity of the carbon-based conductive materials of the lower carbon-based electrode material layer 151C and the upper carbon-based electrode material layer 153C. In one embodiment, the lower metallic material layer 151M comprises a metallic material having electrical conductivity that is at least 10 times (which may be at least 30 times and/or at least 100 times and/or at least 1,000 times) the electrical conductivity of the carbon-based conductive material of lower carbon-based electrode material layer 151C, and the upper metallic material layer 153M comprises a second metallic material having electrical conductivity that is at least 10 times (which may be at least 30 times and/or at least 100 times and/or at least 1,000 times) the electrical conductivity of the carbon-based conductive material of the upper carbon-based electrode material layer 153C.

Generally, each of the lower metallic material layer 151M and the upper metallic material layer 153M may comprise, and/or may consist essentially of, a high-conductivity metallic material that has a high electrical conductivity, and thus, is capable of functioning as a current-spreading material that prevents concentration of electrical current in the non-Ohmic material of the non-Ohmic selector material layer 152L. In one embodiment, the lower metallic material layer 151M and/or the upper metallic material layer 153M may comprise, and/or may consist essentially of, an elemental metal, a conductive metallic carbide, or a conductive metallic nitride. In one embodiment, the lower metallic material layer 151M and/or the upper metallic material layer 153M may comprise, and/or may consist essentially of, a respective elemental metal having a melting point higher than 2,000 degrees Celsius (such as refractory metals). In one embodiment, the lower metallic material layer 151M and/or the upper metallic material layer 153M may comprise, and/or may consist essentially of, a respective elemental metal selected from ruthenium, niobium, molybdenum, tantalum, tungsten, or rhenium. In one embodiment, the lower metallic material layer 151M and/or the upper metallic material layer 153M may comprise, and/or may consist essentially of, a conductive metallic carbide such as tungsten carbide. In one embodiment, the lower metallic material layer 151M and/or the upper metallic material layer 153M may comprise, and/or may consist essentially of, a conductive metallic nitride such as tungsten nitride, titanium nitride, or tantalum nitride.

Generally, the lower metallic material layer 151M and the upper metallic material layer 153M may have a lower thickness than the lower carbon-based electrode material layer 151C and the upper carbon-based electrode material layer 153C. Each of the lower metallic material layer 151M and the upper metallic material layer 153M may have a respective thickness in a range from 0.2 nm to 10 nm, such as from 1 nm to 5 nm, although lesser and greater thicknesses may also be employed. In one embodiment, the ratio of the thickness of the lower carbon-based electrode material layer 151C to the thickness of the lower metallic material layer 151M may be in a range from 3.0 to 500, such as from 10 to 100, although lesser and greater ratios may also be employed. In one embodiment, the ratio of the thickness of the upper carbon-based electrode material layer 153C to the thickness of the upper metallic material layer 153M may be in a range from 3.0 to 500, such as from 10 to 100, although lesser and greater ratios may also be employed.

In one embodiment, the non-Ohmic selector material layer 152L within the selector material layers 150L can include any suitable non-Ohmic selector material which exhibits non-linear electrical behavior. For example, the non-Ohmic selector material may comprise an ovonic threshold switch (OTS) material. As used herein, an ovonic threshold switch material refers to a material that displays a non-linear resistivity curve under an applied external bias voltage such that the resistivity of the material decreases with the magnitude of the applied external bias voltage. In other words, the ovonic threshold switch material is non-Ohmic, and becomes more conductive under a higher external bias voltage than under a lower external bias voltage. As used herein, an ovonic threshold switch is a device that includes a chalcogen-containing ovonic threshold switch material layer which does not crystallize in a low resistivity state under a voltage above the threshold voltage, and reverts back to a high resistivity state when not subjected to a voltage above a critical holding voltage across the ovonic threshold switch material layer.

In another embodiment, the non-Ohmic selector material may comprise a volatile conductive bridge material or at least one non-threshold switch material, such as a tunneling selector material or diode materials (e.g., materials for p-n semiconductor diode, p-i-n semiconductor diode, Schottky diode or metal-insulator-metal diode). Thus, the material layer 152L may comprise a diode layer stack, such as a layer stack of p-doped semiconductor material layer and an n-doped semiconductor material layer, or a layer stack of a p-doped semiconductor material layer, an intrinsic semiconductor material layer, and an n-doped semiconductor material layer.

An ovonic threshold switch material (OTS material) can be non-crystalline (for example, amorphous) in a high resistivity state, and can remain non-crystalline (for example, remain amorphous) in a low resistivity state during application of a voltage above its threshold voltage across the OTS material. The ovonic threshold switch material can revert back to the high resistivity state when the high voltage above its threshold voltage is lowered below a critical holding voltage. Throughout the resistivity state changes, the ovonic threshold switch material can remain non-crystalline (e.g., amorphous). In one embodiment, the ovonic threshold switch material can comprise an amorphous chalcogenide material, such as a GeSeAs alloy, a GeSeAsTe alloy, a GeTeAs alloy, a GeSeTe alloy, a GeSe alloy, a SeAs alloy, a AsTe alloy, a GeTe alloy, a SiTe alloy, a SiAsTe alloy, or SiAsSe alloy. The chalcogenide material may be undoped or doped with at least one of N, 0, C, P, Ge, As, Te, Se, In, or Si. The thickness of the non-Ohmic material layer 152L can be, for example, in a range from 1 nm to 50 nm, such as from 5 nm to 25 nm, although lesser and greater thicknesses can also be employed.

The optional conductive material layer 160L includes a nonmagnetic conductive material such as Ta and/or Pt, which can function as a seed layer for the magnetic-tunnel-junction-level (MTJ-level) material layers to be formed thereon The thickness of the electrically conductive layer 30L can be in a range from 1 nm to 10 nm, although lesser and greater thicknesses can also be employed.

The optional first image transfer assist layer 171L includes a hard mask material that can provide a high etch resistance for an anisotropic etch process to be subsequently employed with respect to the material of the underlying layers. For example, the optional first image transfer assist layer 171L may comprise a metal such as TiN, TaN, WN, Ti, W, Cr, or Ru. The thickness of the first image transfer assist layer 171L may be in a range from 1 nm to 30 nm, such as from 2 nm to 10 nm, although lesser and greater thicknesses may also be employed.

A photoresist layer can be applied over the selector-level material layers (150L, 160L) and the optional first image transfer assist layer 171L, and can be lithographically patterned to form a first patterned photoresist layer 157. The first patterned photoresist layer 157 can be patterned with a periodic line-and-space pattern in which each line laterally extends along the first horizontal direction hd1. The pitch of the periodic line-and-space pattern along a second horizontal direction hd2 that is perpendicular to the first horizontal direction hd1 is herein referred to as a second pitch p2. The second pitch p2 may be in a range from 10 nm to 300 nm, such as from 30 nm to 100 nm, although lesser and greater dimensions may also be employed for the second pitch p2.

Referring to FIGS. 5A-5C, a first anisotropic etch process can be performed to transfer the pattern in the first patterned photoresist layer 157 through the first image transfer assist layer 171L. The first image transfer assist layer 171L can be patterned into etch mask strips 171. Each etch mask strip 171 is a patterned portion of the first image transfer assist layer 171L, and may laterally extend along the first horizontal direction hd1 with a uniform width along the second horizontal direction hd2. A one-dimensional periodic array of etch mask strips 171 can be formed, which can have a periodicity of the second pitch p2 along the second horizontal direction hd2.

Referring to FIGS. 6A-6C, a second anisotropic etch process can be performed to transfer the pattern in the first patterned photoresist layer 157 and/or in the etch mask strips 171 through the selector-level material layers (150L, 160L), the metallic adhesion layer 149L, and through the first electrode material layer 30L. The first patterned photoresist layer 157 and/or in the etch mask strips 171 can be employed as an etch mask for the second anisotropic etch process. The first patterned photoresist layer 157 may be removed prior to the second anisotropic etch process, may be consumed during the second anisotropic etch process, or may be removed after the second anisotropic etch process.

Patterned portions of the selector-level material layers (150L, 160L) comprise a one-dimensional periodic array of selector-level material rails 182R. Each of the selector-level material rails 182R may comprise a selector rail 150R and an optional conductive material strip (e.g., seed layer string) 160S. Each selector rail 150R is a patterned portion of the selector material layers 150L, and each conductive material strip 160S is a patterned portion of the conductive material layer 160L. Each selector rail 150R may include a vertical stack of a lower selector electrode 151, a non-Ohmic selector material portion 152, and a upper selector electrode 153. Each lower selector electrode 151 is a patterned portion of the lower selector electrode material layer 151L. Each non-Ohmic selector material portion 152 is a patterned portion of the non-Ohmic selector material layer 152L. Each upper selector electrode 153 is a patterned portion of the upper selector electrode material layer 153L.

Patterned portions of the metallic adhesion layer 149L comprise metallic adhesion material portions 149. Patterned portions of the first electrically conductive layer 30L comprise first electrically conductive lines 30. The first electrically conductive lines 30 can laterally extend along the first horizontal direction hd1, and can have a uniform width along the second horizontal direction hd2. The first electrically conductive lines 30 may comprise word lines formed as a periodic one-dimensional array of first electrically conductive lines 30 having a periodicity of the second pitch p2 along the second horizontal direction hd2.

Generally, vertical stacks (30, 150R, 160S) including a respective first electrically conductive line 30, a respective selector rail 150R, and a respective electrically conductive strip 160S can be formed over the substrate 8. The vertical stacks (30, 150R, 160S) laterally extend along the first horizontal direction hd1, and are laterally spaced apart from each other along the second horizontal direction hd2. Each of the selector rails includes a lower selector electrode 151, a non-Ohmic selector material portion 152 overlying the lower selector electrode 151, and an upper selector electrode 153 overlying the non-Ohmic selector material portion 152.

Referring to FIGS. 7A-7C, a dielectric spacer material layer 178L can be formed over the vertical stacks (30, 150R, 160S) and the optional etch mask strips 171. In one embodiment, the dielectric spacer material layer 178L can be conformally deposited over, and around, the two-dimensional array of vertical stacks (30, 150R, 160S) including a respective first electrically conductive line 30, a respective selector rail 150R, and a respective electrically conductive strip 160S. In one embodiment, the dielectric spacer material layer 178L may comprise a dielectric material that can protect the materials of the selector rails 150R. For example, the dielectric spacer material layer 178L may comprise, and/or may consist essentially of, silicon nitride, silicon carbide nitride (i.e., silicon carbonitride), silicon oxynitride, silicon oxide, or metal oxide (e.g., aluminum oxide). The thickness of the dielectric spacer material layer 178L may be in a range from 1 nm to 60 nm, such as from 2 nm to 30 nm, although lesser and greater thicknesses may also be employed.

Referring to FIGS. 8A-8C, a dielectric fill material can be deposited in the gaps between neighboring pairs of vertical stacks (30, 150R, 160S) to fill the volumes of the gaps. The dielectric fill material may comprise silicon oxide, organosilicate glass, silicon nitride, or a dielectric metal oxide. For example, the dielectric fill material may comprise undoped silicate glass (i.e., silicon oxide) or a doped silicate glass. A planarization process, such as a chemical mechanical polishing process can be performed to remove portions of the dielectric fill material that are deposited above the horizontal plane including the top surfaces of the electrically conductive strips 160S. Remaining portions of the dielectric fill material that fills a respective gap between a respective neighboring pair of vertical stacks (30, 150R, 160S) constitute selector-level dielectric material portions 40. The etch mask strips 171 can be collaterally removed during the planarization process. Top surfaces of the selector-level dielectric material portions 40 can be coplanar with the top surfaces of the electrically conductive strips 160S. If the upper portion of the selector electrode 153 comprises a carbon-based material, then the electrically conductive strips 160S protects the carbon-based material from damage during the CMP process. If the upper portion of the selector electrode 153 comprises a metal or metal alloy, then the electrically conductive strips 160S may be omitted.

The selector-level dielectric material portions 40 laterally extend along the first horizontal direction hd1, and are laterally interlaced with the vertical stacks (30, 150R, 160S) along the second horizontal direction hd2. The dielectric spacer material layer 178L may be divided into a plurality of dielectric spacers 178. In one embodiment, the dielectric spacers 178 may embed a respective one of the selector-level dielectric material portions 40, and may contact lengthwise sidewalls of a pair of vertical stacks (30, 150R, 160S).

Figure 9A:
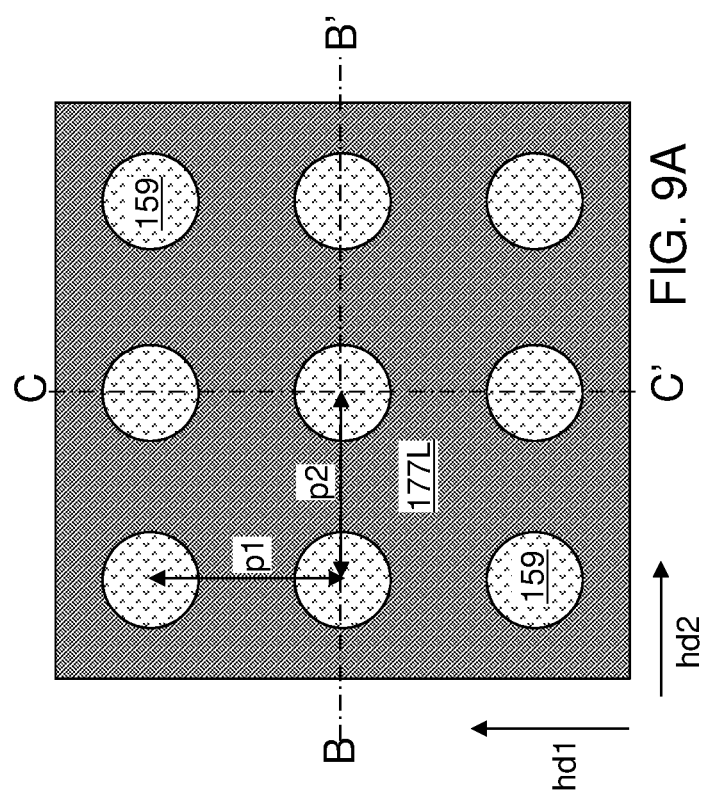

Referring to FIGS. 9A-9C, magnetic tunnel junction-level (MTJ-level) material layers (112L, 114L, 130L, 144L, 148L) can be formed over the vertical stacks (30, 150R, 160S) and the selector-level dielectric material portions 40. The MTJ-level material layers may comprise, for example, an optional continuous superlattice layer 112L, an optional continuous antiferromagnetic coupling layer 114L, continuous magnetic tunnel junction (MTJ) material layers 130L, an optional continuous dielectric capping layer 144L, and an optional continuous metallic capping layer 148L. The MTJ material layers 130L may comprises a layer stack including a continuous reference layer 132L, a continuous nonmagnetic tunnel barrier layer 134L, a continuous free layer 136L.

The continuous superlattice layer 112L can have the same material composition as the superlattice layer 112 described with reference to FIG. 2.

The continuous antiferromagnetic coupling layer 114L, if present, can have the same material composition as the antiferromagnetic coupling layer 114 described with reference to FIG. 2. In one embodiment, the continuous antiferromagnetic coupling layer 114 may comprise ruthenium, iridium, or IrMn alloy, and may have thickness in a range from 0.1 nm to 1.0 nm, such as from 0.2 nm to 0.6 nm.

The continuous reference layer 132L can have the same material composition as the reference layer 132 described with reference to FIG. 2. In one embodiment, the continuous reference layer 132L can include a CoFe alloy or a CoFeB alloy. Optionally, the continuous reference layer 132L may additionally include a thin non-magnetic layer comprised of tantalum or tungsten having a thickness of 0.2 nm-0.5 nm and a thin CoFeB layer having a thickness in a range from 0.5 nm to 3 nm.

The continuous nonmagnetic tunnel barrier layer 134L includes any insulating tunnel barrier material such as magnesium oxide. The thickness of the continuous nonmagnetic tunnel barrier layer 134L can be 0.7 nm to 1.3 nm, such as about 1 nm.

The continuous free layer 136L can have the same material composition as the free layer 136 described with reference to FIG. 2. In one embodiment, the continuous free layer 136L can include a CoFe alloy or a CoFeB alloy. Optionally, the continuous free layer 136L may additionally include a thin non-magnetic layer comprised of tantalum or tungsten having a thickness of 0.2 nm-0.5 nm and a thin CoFeB layer having a thickness in a range from 0.5 nm to 3 nm.

The continuous dielectric capping layer 144L can have the same material composition as the dielectric capping layer 144 described with reference to FIG. 2. The continuous dielectric capping layer 144L may comprise a thin magnesium oxide layer that is thin enough to enable tunneling of electrical current, such as a thickness in a range from 0.4 nm to 1.0 nm.

The continuous metallic capping layer 148L can have the same material composition as the metallic capping layer 144 described with reference to FIG. 2. The continuous metallic capping layer 148L may comprise a non-magnetic, electrically conductive material, such as W, Ti, Ta, WN, TiN, TaN, Ru, and Cu. The thickness of the continuous metallic capping layer 148L can be in a range from 10 nm to 100 nm, although lesser and greater thicknesses can also be employed.

An optional second image transfer assist layer 173L, an optional patterning film 176L, and an optional second image transfer assist layer 177L can be formed over the MTJ-level material layers (112L, 114L, 130L, 144L, 148L).

The optional second image transfer assist layer 173L includes a material that can provide a high etch resistance for an anisotropic etch process to be subsequently employed with respect to the materials of the underlying layers, thereby providing a high etch selectivity for the etch process that patterns the underlying layers. For example, the optional second image transfer assist layer 173L may comprise a metal such as TiN, TaN, WN, Ti, Ta, W, Cr, Pt, or Ru. For example, the second image transfer assist layer 173L may comprise a bilayer comprising a lower TiN sublayer and an upper Ru or Pt protective sublayer. The thickness of the second image transfer assist layer 173L may be in a range from 1 nm to 30 nm, such as from 2 nm to 10 nm, although lesser and greater thicknesses may also be employed.

The optional patterning film 176L comprises a carbon-based material that can enhance pattern fidelity during subsequent anisotropic etch processes. For example, the optional patterning film 176L may be composed primarily of amorphous carbon or diamond-like carbon.

The optional third image transfer assist layer 177L, if present, includes a material that can provide a high etch resistance for an anisotropic etch process to be subsequently employed with respect to the material of the patterning film 176L. For example, the optional third image transfer assist layer 177L may comprise a metal such as Cr or Ru. The thickness of the third image transfer assist layer 177L may be in a range from 1 nm to 30 nm, such as from 2 nm to 10 nm, although lesser and greater thicknesses may also be employed.

A photoresist layer can be applied over the MTJ-level material layers (112L, 114L, 130L, 144L, 148L), the optional patterning film 176L, and the optional second and third image transfer assist layers (173L, 177L), and can be lithographically patterned to form a second patterned photoresist layer 159. In one embodiment, the second patterned photoresist layer 159 may be formed as a two-dimensional array of discrete patterned photoresist material portions 159. The two-dimensional array of discrete patterned photoresist material portions of the second patterned photoresist layer 159 can be formed as a periodic array having the first pitch p1 along the first horizontal direction hd1 and having the second pitch p2 along the second horizontal direction hd2. In one embodiment, each row of discrete patterned photoresist material portions may be formed over the MTJ-level material layers. The lateral dimension of each of the discrete patterned photoresist material portions along the second horizontal direction hd2 may be the same as, may be less than, or may be greater than the width of the respective underlying vertical stack (30, 150R, 160S).

Referring to FIGS. 10A-10C, the pattern in the two-dimensional array of discrete patterned photoresist material portions of the second patterned photoresist layer 159 can be transferred through the third image transfer assist layer 177L, the patterning film 176L and the second image transfer assist layer 173L by performing an anisotropic etch process such as a reactive ion etch process. The third image transfer assist layer 177L can be divided into a two-dimensional array of second etch mask plates 177. The patterning film 176L can be divided into a two-dimensional array of patterning film plates 176. The second image transfer assist layer 173L can be divided into a two-dimensional array of second etch mask plates 173. The two-dimensional array of second discrete patterned photoresist material portions can be subsequently removed, for example, by ashing. A two-dimensional array of discrete masking structures (173, 176, 177) can be formed. Each discrete masking structure (173, 176, 177) may comprise a patterning film plate 176, a second etch mask plate 173 and/or a third etch mask plate 177.

Referring to FIGS. 11A-11C, an anisotropic etch process can be performed to transfer the pattern in the two-dimensional array of discrete masking structures (173, 176, 177) through the MTJ-level material layers (112L, 114L, 130L, 144L, 148L) and into upper portions of the vertical stacks (30, 150R, 160S) and the selector-level dielectric material portions 40. The anisotropic etch process may comprise an ion beam etch process (also known as ion milling).

The MTJ-level material layers (112L, 114L, 130L, 144L, 148L) can be patterned into a two-dimensional array of magnetic tunnel junction (MTJ) pillar structures 184. According to an aspect of the present disclosure, physically exposed surfaces of the MTJ pillar structures 184 may be formed with taper angles. The taper angles can be measured with respect to the vertical direction that is perpendicular to the top surface of the substrate 8. In one embodiment, the taper angle may be in a range from 3 degrees to 30 degrees, such as from 6 degrees to 20 degrees, although lesser and greater taper angles may also be employed.

Each MTJ pillar structure 184 may comprise a stack of an optional superlattice layer 112, an optional antiferromagnetic coupling layer 114, a magnetic tunnel junction 130, an optional dielectric capping layer 144, and an optional metallic capping layer 148. The magnetic tunnel junction 130 includes a reference layer 132, a tunnel barrier layer 134, and a free layer 136. Each superlattice layer 112 is a patterned portion of the continuous superlattice layer 112L. Each antiferromagnetic coupling layer 114 is a patterned portion of the continuous antiferromagnetic coupling layer 114L. Each magnetic tunnel junction 130 is a patterned portion of the magnetic tunnel junction material layers 130L. Each dielectric capping layer 144 is a patterned portion of the continuous dielectric capping layer 144L. Each metallic capping layer 148 is a patterned portion of the continuous metallic capping layer 148L. Each reference layer 132 is a patterned portion of the continuous reference layer 132L. Each tunnel barrier layer 134 is a patterned portion of the continuous tunnel barrier layer 134L. Each free layer 136 is a patterned portion of the continuous free layer 136L.

Generally, the pattern in the two-dimensional array of discrete patterned photoresist material portions comprising the second patterned photoresist layer 159 can be transferred through the optional second and third image transfer assist layers (173L, 177L), the optional patterning film 176L, the magnetic tunnel junction material layers 130L, and at least partly through the selector rails 150R by performing an etch process, which can be an anisotropic etch process (e.g., an ion beam etch process). Thus, the layer stack including the MTJ-level material layers (112L, 114L, 130L, 144L, 148L) can be patterned into the two-dimensional array of magnetic tunnel junction pillar structures 184 by anisotropically etching the layer stack employing the two-dimensional array of discrete masking structures (173, 176, 177) as an etch mask. The MTJ-level material layers (112L, 114L, 130L, 144L, 148L) can be patterned such that each of the magnetic tunnel junction pillar structures 184 is formed with a respective tapered sidewall. The total thickness of the MTJ-level material layers (112L, 114L, 130L, 144L, 148L) and the taper angle can be selected such that each of the magnetic tunnel junction pillar structures 184 has a respective bottom surface having a lateral extent along the second horizontal direction that is greater than the width of a respective underlying vertical stack (30, 150R, 160S) along the second horizontal direction hd2. Patterned portions of the magnetic tunnel junction material layers 130L comprise a two-dimensional array of magnetic tunnel junctions 130. According to an aspect of the present disclosure, periodic notches (e.g., indentations) having the first pitch p1 can be formed at least in an upper portion of each of the selector rails 150R along the first horizontal direction hd1, as shown in FIG. 11C.

The etch process divides each optional conductive material strip 160S into a respective row of conductive material plates (e.g., seed layer plates) 160. Each conductive material plate 160 contacts a bottom surface of a respective MTJ pillar structure 184. The etch process divides the upper selector electrode 153 of each selector rail 150R into a respective plurality of discrete upper selector electrodes 153 that are laterally spaced apart from each other along the first horizontal direction hd1. In one embodiment, the lower selector electrode 151 of each selector rail 150R may remain as a single continuous rail structure that laterally extends along the first horizontal direction hd1 and underlies a respective row of magnetic tunnel junctions 130 of the two-dimensional array of magnetic tunnel junctions 130.

Each selector rail 150R is partially divided into a respective row of selector-containing notched rail structures 182 underlying respective MTJ pillar structures 184. Each selector-containing notched rail structure 182 contains notches 182N which separate at least the upper selector electrode rail in the selector-containing notched rail structure 182 into a plurality of pillar shaped upper selector electrodes 153 along the first horizontal direction hd1. Each respective pillar shaped upper selector electrode 153 underlies only one respective MTJ pillar structures 184. Likewise, each respective MTJ pillar structures 184 overlies only one respective pillar shaped upper selector electrode 153. Therefore, the respective pillar shaped upper selector electrodes 153 do not electrically short adjacent MTJ pillar structures 184 which are separated along the first horizontal direction hd1.

Each combination of an optional conductive material plate 160, an underlying patterned portion of a respective selector rail 150R, and an underlying segment of an optional respective metallic adhesion material portion 149, if present, constitutes a selector-containing notched rail structure 182. The two-dimensional array of magnetic tunnel junction pillar structures 184 is located above the array of selector-containing notched rail structures 182. Each vertical stack of a portion of the selector-containing notched rail structure 182 containing one pillar shaped upper selector electrode 153 and an overlying MTJ pillar structure 184 functions as a memory cell 180 described with reference to FIGS. 1 and 2. Each contiguous combination of memory cells 180 that are arranged along the first horizontal direction hd1 over the respective selector-containing notched rail structure 182 constitutes a selector-magnetic tunnel junction (selector-MTJ) assembly 180A. In other words, each selector-MTJ assembly 180A includes a row of memory cells 180 that include a portion of the common selector 182 and separate MTJ pillar structures 184 arranged along the first horizontal direction hd1.

Rows of selector-MTJ assemblies 180A can overlie the first electrically conductive lines 30. Each of the selector-MTJ assemblies 180A is located on a respective one of the first electrically conductive lines 30 and comprises a respective selector-containing notched rail structure 182 that extends along the first horizontal direction hd1 and a respective row of magnetic tunnel junction (MTJ) pillar structures 184 that are arranged along the first horizontal direction hd1 over the respective selector-containing notched rail structure 182.

In one embodiment, the non-Ohmic selector material portion 152 of each selector rail 150R may remain as a single continuous rail structure in the respective selector-containing notched rail structure 182 that laterally extends along the first horizontal direction hd1 and underlies a respective row of magnetic tunnel junctions 184 of the two-dimensional array of magnetic tunnel junctions 184. In one embodiment, the etch process forms periodic notches 182N (e.g., indentations) having the first pitch p1 along the first horizontal direction hd1 in an upper portion of the non-Ohmic selector material portion 152 of each selector rail 150R. Alternatively, the bottom surface of the notches 182N may be located in the same horizontal plane as the upper surface of the non-Ohmic selector material portion 152, such that there are no notches in the non-Ohmic selector material portion 152.

In one embodiment, the lower selector electrode 151 of each selector rail 150R may also remain as a single continuous rail structure in the respective selector-containing notched rail structure 182 that laterally extends along the first horizontal direction hd1 and underlies a respective row of magnetic tunnel junctions 184 of the two-dimensional array of magnetic tunnel junctions 184.

Each selector-containing notched rail structure 182 comprises a pair of lengthwise sidewalls that laterally extend along the first horizontal direction hd1. In one embodiment, two lengthwise sidewalls of the respective one of the first electrically conductive lines 30 that underlies the respective selector-containing notched rail structure 182 can be located within the same two vertical planes. Thus, the selector-containing notched rail structure 182 and the first electrically conductive lines (e.g., word lines) 30 are patterned using the same photolithography step (and optionally the same etching step). This reduces the number of lithography and/or etching steps in the process.

In one embodiment, each selector-containing notched rail structure 182 comprises a vertical stack including a lower selector electrode 151, a non-Ohmic selector material portion 152 overlying the lower selector electrode 151, and upper selector electrodes 153 overlying the non-Ohmic selector material portion 152. In one embodiment, each neighboring pair of upper selector electrodes 153 within each selector-containing notched rail structure 182 is laterally spaced apart from each other along the first horizontal direction hd1. In one embodiment, tapered sidewall surfaces of the non-Ohmic selector material portions 152 of the rows of selector-containing notched rail structures 182 can be physically exposed.

In one embodiment, the rows of MTJ pillar structures 184 overlying the respective selector-containing notched rail structures 182 can be arranged as a two-dimensional periodic array of MTJ pillar structures 184 having the first pitch p1 along the first horizontal direction hd1 and having the second pitch p2 along the second horizontal direction hd2. In one embodiment, each MTJ pillar structure 184 within the two-dimensional periodic array of MTJ pillar structures 184 has a respective tapered vertical cross-sectional profile. In one embodiment, each MTJ pillar structure 184 within the two-dimensional periodic array of MTJ pillar structures 184 has a lateral extent along the second horizontal direction hd2 that is greater than a width of a respective underlying first electrically conductive line 30 along the second horizontal direction hd2.

Upper regions of the selector-level dielectric material portions 40 that are not masked by the two-dimensional array of MTJ pillar structures 184 can be removed by the etch process. The selector-level dielectric material portions 40 laterally extend along the first horizontal direction hd1, are laterally interlaced with the rows of selector-containing notched rail structures 182 along the second horizontal direction hd2, and may contact bottom surfaces of a respective neighboring pair of rows of MTJ pillar structures 184 within the two-dimensional periodic array of MTJ pillar structures 184. In one embodiment, a recessed horizontal surface 40H may be formed within the vertically recessed areas of the selector-level dielectric material portions 40, as shown in FIG. 11B. The recessed horizontal surface can be adjoined to tapered sidewall segments 40T of a respective selector-level dielectric material portions 40.

In one embodiment, the dielectric liners 178 can laterally extend along the first horizontal direction hd1, can embed a respective one of the selector-level dielectric material portions 40, and can contact lengthwise sidewalls of a respective set of two selector-containing notched rail structures 182. Each dielectric liner 178 may contact bottom surfaces of a respective pair of rows of magnetic tunnel junction pillar structure 184 within the two-dimensional array of magnetic tunnel junction pillar structures 184.

The two-dimensional array of second etch mask plates 177 can be consumed during the etch process (which may be an anisotropic etch process, such as an ion bean etch process). The patterning film plates 176 can be subsequently removed, for example, by ashing.

Referring to FIGS. 12A-12C, a dielectric fill material can be deposited in the gaps between neighboring pairs of the MTJ pillar structures 184, and can be subsequently planarized to remove portions of the dielectric fill material from above the horizontal plane including the top surfaces of the MTJ pillar structures 184. The remaining portions of the dielectric fill material comprises a dielectric matrix layer 80. The dielectric matrix layer 80 laterally surrounds the two-dimensional array of magnetic tunnel junction pillar structures 184, and overlies the selector-level dielectric material portions 40. The dielectric matrix layer 80 comprises downward-protruding portions that extend downward below a horizontal plane including bottom surfaces of the two-dimensional array of magnetic tunnel junction pillar structures 184, and have tapered surfaces contacting the selector-level dielectric material portions 40.

The dielectric matrix layer 80 laterally surrounds the rows of selector-MTJ assemblies 180A. The two-dimensional periodic array of downward protrusions of the dielectric matrix layer 80 extends into boundaries between each neighboring pair of selector-containing notched rail structures 182. Generally, the two-dimensional periodic array of downward protrusions of the dielectric matrix layer 80 extends into regions of the selector-level dielectric material portions 40 that do not have an areal overlap with the two-dimensional periodic array of MTJ pillar structures 184.

In one embodiment, tapered downward protrusions of the dielectric matrix layer 80 contact each of selector-containing notched rail structures 182 along the first horizontal direction hd1. In one embodiment, each neighboring pair of upper selector electrodes 153 within each of selector-containing notched rail structures 182 is laterally spaced apart from each other by a respective portion of the tapered downward protrusions of the dielectric matrix layer 80, as shown in FIG. 12C.

In one embodiment, bottommost surface segments of the tapered downward protrusions of the dielectric matrix layer 80 contact the non-Ohmic selector material portions 152 of rows of selector-containing notched rail structures 182 and do not contact the lower selector electrodes 151.

Referring to FIGS. 13A-13C, a dielectric material can be deposited over the two-dimensional array of MTJ pillar structures 184 to form a second line-level dielectric layer 92. Line trenches laterally extending along the second horizontal direction hd2 can be formed through the second line-level dielectric layer 92 above each column of MTJ pillar structures 184 arranged along the second horizontal direction hd2. A conductive material can be deposited in the line trenches, and excess portions of the conductive material can be removed from above the horizontal plane including the top surface of the second line-level dielectric layer 92. Remaining portions of the conductive material filling the line trenches constitute second electrically conductive lines 90. The second electrically conductive lines 90 comprise, and/or consist essentially of, a nonmagnetic electrically conductive material such as Al, Cu, W, Ru, Mo, Nb, Ti, Ta, TiN, TaN, WN, MoN, or combinations thereof. The thickness of the second electrically conductive lines 90 can be in a range from 20 nm to 100 nm, although lesser and greater thicknesses can also be employed. Alternatively, instead of using the above-described damascene process to form the second electrically conductive lines 90, these lines may be formed by a pattern and etch process. In the pattern and etch process, a continuous electrically conductive layer is patterned into the second electrically conductive lines 90 by photolithography and etching. The first line-level dielectric layer 92 is then deposited between the second electrically conductive lines 90 and optionally planarized with the top surfaces of the second electrically conductive lines 90.

Referring to FIGS. 14A-14C, an alternative configuration of the exemplary structure can be derived from the exemplary structure by extending the anisotropic etch process that divides each upper selector electrode 153 to divide each non-Ohmic selector material portion 152 (as provided at the processing steps of FIGS. 6A-6C) into a respective plurality of pillar shaped non-Ohmic selector material portions 152 that are separated from each other and arranged along the first horizontal direction hd1. In this case, the anisotropic etch process may form the periodic notches 182N (e.g., indentations) having the first pitch p1 along the first horizontal direction hd1 in an upper portion of the lower selector electrode 151 of each selector rail 150R. Upon formation of the dielectric matrix layer 80, the dielectric matrix layer 80 can contact indented surfaces of the lower selector electrodes 151.

In this alternative embodiment in which the notches 182N extend through the non-Ohmic selector material portions 152 and expose the lower selector electrodes 151, the bottommost surface segments of the tapered downward protrusions of the dielectric matrix layer 80 contact the lower selector electrodes 151 of the selector-containing notched rail structures 182 and do not contact the first electrically conductive lines 30.

Referring to FIGS. 1-14C and according to various embodiments of the present disclosure, a memory array comprises: first electrically conductive lines 30 laterally extending along a first horizontal direction hd1 and laterally spaced apart along a second horizontal direction hd2; selector-magnetic tunnel junction (selector-MTJ) assemblies 180A overlying the first electrically conductive lines 30, wherein each of the selector-MTJ assemblies 180A is located over a respective one of the first electrically conductive lines 30 and comprises a respective selector-containing notched rail structure 182 that extends along the first horizontal direction hd1 and a respective row of magnetic tunnel junction (MTJ) pillar structures 184 that are arranged along the first horizontal direction hd1 that overlie the respective selector-containing notched rail structure; a dielectric matrix layer 80 laterally surrounding the rows of selector-MTJ assemblies 180A, wherein a two-dimensional periodic array of downward protrusions of the dielectric matrix layer 80 extends into boundaries between each neighboring pair of the selector-containing notched rail structures 182; and second electrically conductive lines 90 laterally extending along the second horizontal direction hd2 and overlying a respective column of the MTJ pillar structures 184 that are arranged along the second horizontal direction hd2.

In one embodiment, each selector-containing notched rail structure 182 comprises a pair of lengthwise sidewalls that laterally extend along the first horizontal direction hd1. In one embodiment, the lengthwise sidewalls of all selector-containing notched rail structures 182 are located within two vertical planes that are perpendicular to the second horizontal direction hd2. In one embodiment, two lengthwise sidewalls of the respective one of the first electrically conductive lines 30 are located within the two vertical planes.

In one embodiment, the downward protrusions of the dielectric matrix layer 80 extend into notches 182N in the selector-containing notched rail structures 182. In one embodiment, each selector-containing notched rail structure 182 comprises a vertical stack including a lower selector electrode 151, a non-Ohmic selector material portion 152 overlying the lower selector electrode 151, and an upper selector electrode 153 overlying the non-Ohmic selector material portion 152. A neighboring pair of the upper selector electrodes 153 within each of the selector-containing notched rail structures 182 are laterally spaced apart from each other by a respective portion of the downward protrusions of the dielectric matrix layer 80. In one embodiment, the downward protrusions comprise tapered downward protrusions.

In one embodiment, bottommost surface segments of the tapered downward protrusions of the dielectric matrix layer 80 contact the non-Ohmic selector material portions 152 of the selector-containing notched rail structures 182 and do not contact the lower selector electrodes 151.

In one embodiment, bottommost surface segments of the tapered downward protrusions of the dielectric matrix layer 80 contact the lower selector electrodes 151 of the selector-containing notched rail structures 182 and do not contact the first electrically conductive lines 30.

In one embodiment, the MTJ pillar structures 184 are arranged as a two-dimensional periodic array of MTJ pillar structures 184 having a first pitch p1 along the first horizontal direction hd1 and having a second pitch along the second horizontal direction hd2; and each MTJ pillar structure 184 within the two-dimensional periodic array of MTJ pillar structures 184 has a respective tapered vertical cross-sectional profile.

In one embodiment, each MTJ pillar structure 184 within the two-dimensional periodic array of MTJ pillar structures 184 has a lateral extent along the second horizontal direction hd2 that is greater than a width of a respective underlying first electrically conductive line 30 along the second horizontal direction hd2.

In one embodiment, the memory array may comprise selector-level dielectric material portions 40 laterally extending along the first horizontal direction hd1, laterally interlaced with the selector-containing notched rail structures 182 along the second horizontal direction hd2, and contacting bottom surfaces of a respective neighboring pair of rows of MTJ pillar structures 184 within the two-dimensional periodic array of MTJ pillar structures 184.

In one embodiment, the downward protrusions of the dielectric matrix layer 80 extend into regions of the selector-level dielectric material portions 40 that do not have an areal overlap with the two-dimensional periodic array of MTJ pillar structures 184.

In one embodiment, the memory array comprises dielectric spacers 178 laterally extending along the first horizontal direction hd1, embedding a respective one of the selector-level dielectric material portions 40, and contacting lengthwise sidewalls of a respective set of two of the selector-containing notched rail structures 182.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory array, comprising:
   first electrically conductive lines laterally extending along a first horizontal direction and laterally spaced apart along a second horizontal direction;
   selector-magnetic tunnel junction (selector-MTJ) assemblies overlying the first electrically conductive lines, wherein each of the selector-MTJ assemblies is located over a respective one of the first electrically conductive lines and comprises a respective selector-containing notched rail structure that extends along the first horizontal direction, a respective row of magnetic tunnel junction (MTJ) pillar structures that are arranged along the first horizontal direction and that overlie the respective selector-containing notched rail structure and a respective row of conductive material plates arranged along the first horizontal direction and located between the respective selector-containing notched rail structure and the respective row of MTJ pillar structures,
   wherein each of the MTJ pillar structures within the respective row of MTJ pillar structures has a respective bottom surface having a greater lateral extent along the second horizontal direction than a maximum lateral extent of a top surface of the respective selector-containing notched rail structure, and
   wherein the respective selector-containing notched rail structure comprises:
   a non-Ohmic selector material portion that comprises a single continuous rail structure that laterally extends along the first horizontal direction, has an areal overlap with each of the MTJ pillar structures within the respective row of MTJ pillar structures in a plan view along a vertical direction, and has an areal overlap with each conductive material plate within the respective row of conductive material plates in the plan view along the vertical direction; and
   a respective row of upper selector electrodes arranged along the first horizontal direction, laterally spaced apart from each other by notches in the selector-containing notched rail structures, and located between the non-Ohmic selector material portion and the respective row of conductive material plates;
   a dielectric matrix layer laterally surrounding the rows of selector-MTJ assemblies, wherein a two-dimensional periodic array of downward protrusions of the dielectric matrix layer extends into boundaries between each neighboring pair of the selector-containing notched rail structures; and
   second electrically conductive lines laterally extending along the second horizontal direction and overlying a respective column of the MTJ pillar structures that are arranged along the second horizontal direction.

2. The memory array of claim 1, wherein each of the selector-containing notched rail structures comprises a pair of lengthwise sidewalls that laterally extend along the first horizontal direction.

3. The memory array of claim 2, wherein the lengthwise sidewalls of each of the selector-containing notched rail structures are located within two vertical planes that are perpendicular to the second horizontal direction, and wherein two lengthwise sidewalls of the respective one of the first electrically conductive lines are located within the two vertical planes.

4. The memory array of claim 1, wherein the downward protrusions of the dielectric matrix layer extend into notches in the selector-containing notched rail structures.

5. The memory device of claim 4, wherein:
   each of the selector-containing notched rail structures comprises a vertical stack including a lower selector electrode that underlies the non-Ohmic selector material portion the upper selector electrodes overlying the non-Ohmic selector material portion and each having a respective overlap with a respective segment of the non-Ohmic selector material portion in the plan view; and
   a neighboring pair of the upper selector electrodes within each of the selector-containing notched rail structures are laterally spaced apart from each other by a respective one of the downward protrusions of the dielectric matrix layer.

6. The memory device of claim 5, wherein the downward protrusions comprise tapered downward protrusions.

7. The memory device of claim 6, wherein bottommost surface segments of the tapered downward protrusions contact the non-Ohmic selector material portions of the selector-containing notched rail structures and do not contact the lower selector electrodes.

8. The memory device of claim 6, wherein bottommost surface segments of the tapered downward protrusions contact the lower selector electrodes of the selector-containing notched rail structures and do not contact the first electrically conductive lines.

9. The memory array of claim 4, wherein:
   the MTJ pillar structures are arranged as a two-dimensional periodic array of MTJ pillar structures having a first pitch along the first horizontal direction and having a second pitch along the second horizontal direction; and
   each MTJ pillar structure within the two-dimensional periodic array of MTJ pillar structures has a respective tapered vertical cross-sectional profile.

10. The memory device of claim 9, wherein each MTJ pillar structure within the two-dimensional periodic array of MTJ pillar structures has a lateral extent along the second horizontal direction that is greater than a width of a respective underlying first electrically conductive line along the second horizontal direction.

11. The memory array of claim 10, wherein:
the memory array further comprises selector-level dielectric material portions laterally extending along the first horizontal direction, laterally interlaced with the selector-containing notched rail structures along the second horizontal direction, and contacting bottom surfaces of a respective neighboring pair of rows of MTJ pillar structures within the two-dimensional periodic array of MTJ pillar structures; and
the downward protrusions extend into regions of the selector-level dielectric material portions that do not have an areal overlap with the two-dimensional periodic array of MTJ pillar structures.

12. The memory array of claim 11, further comprising dielectric spacers laterally extending along the first horizontal direction, embedding a respective one of the selector-level dielectric material portions, and contacting lengthwise sidewalls of a respective set of two of the selector-containing notched rail structures.

13. The memory array of claim 1, further comprising selector-level dielectric material portions laterally extending along the first horizontal direction, laterally interlaced with the selector-containing notched rail structures along the second horizontal direction, and having a contoured top surface, wherein:
topmost surface segments of contoured top surfaces of the selector-level dielectric material portions are in direct contact with segments of bottommost surfaces of the MTJ pillar structures; and
recessed surface segments of the contoured top surfaces of the select-level dielectric material portions are located below a horizontal plane including the bottommost surfaces of the MTJ pillar structures.

14. The memory array of claim 13, wherein each of the recessed surface segments of the contoured top surfaces of the select-level dielectric material portions laterally extend along the first horizontal direction by a lateral distance that is greater than a center-to-center spacing of neighboring pairs of MTJ pillar structures along the first horizontal direction.

15. The memory array of claim 13, wherein:
the contoured top surfaces of the selector-level dielectric material portions comprise tapered sidewall segments connecting a respective one of the topmost surface segments of the contoured top surfaces and a respective one of the recessed surface segments of the contoured top surfaces; and
each of the tapered sidewall segments has a respective top periphery that coincides with a bottom periphery of a tapered sidewall of a respective one of the MTJ pillar structures.

16. The memory array of claim 15, wherein the tapered sidewall segments of the selector-level dielectric material portions and the recessed surface segments of the selector-level dielectric material portions are in direct contact with a respective segment of a contoured bottom surface of the dielectric matrix layer.

17. The memory array of claim 16, wherein each of the topmost surface segments of the contoured top surfaces of the selector-level dielectric material portions has a respective periphery that consist of a respective straight line segment that is parallel to the first horizontal direction and a respective arc that is connected to two ends of the straight line segment.

18. The memory device of claim 17, wherein the topmost surface segments of the contoured top surfaces of the selector-level dielectric material portions are in direct contact with the dielectric matrix layer only at the straight line segments of the topmost surface segments and at end points of the straight line segments.

19. The memory device of claim 1, wherein:
the non-Ohmic selector material portion consists essentially of an ovonic threshold switch material; and
the respective row of conductive material plates comprises a nonmagnetic conductive material.

20. The memory device of claim 1, wherein the respective selector-containing notched rail structure further comprises a lower selector electrode which comprises a single continuous rail structure that laterally extends along the first horizontal direction, has an areal overlap with each of the MTJ pillar structures within the respective row of MTJ pillar structures in the plan view along the vertical direction, and has an areal overlap with each conductive material plate within the respective row of conductive material plates in the plan view along the vertical direction.

* * * * *